US 9,433,271 B2

(12) United States Patent
Richardson et al.

(10) Patent No.: US 9,433,271 B2
(45) Date of Patent: Sep. 6, 2016

(54) PROTECTIVE COVER WITH AN ACOUSTIC ISOLATION MECHANISM

(71) Applicant: Otter Products, LLC, Fort Collins, CO (US)

(72) Inventors: Curtis R. Richardson, Fort Collins, CO (US); John H. Loudenslager, Phoenix, AZ (US); Jamie L. Johnson, Fort Collins, CO (US); Jason M. Thompson, Fort Collins, CO (US); Jonathan D. Lucas, Encinitas, CA (US); Jeffrey M. Borra, Poway, CA (US)

(73) Assignee: Otter Products, LLC, Fort Collins, CO (US)

( * ) Notice: Subject to any disclaimer, the term of this patent is extended or adjusted under 35 U.S.C. 154(b) by 0 days.

(21) Appl. No.: 14/839,692

(22) Filed: Aug. 28, 2015

(65) Prior Publication Data
US 2015/0366310 A1    Dec. 24, 2015

Related U.S. Application Data

(63) Continuation of application No. 14/289,521, filed on May 28, 2014, now Pat. No. 9,165,550, which is a continuation-in-part of application No. 14/218,662, filed on Mar. 18, 2014, now Pat. No. 9,167,063, which (Continued)

(51) Int. Cl.
*H04M 1/00* (2006.01)
*A45C 11/00* (2006.01)
(Continued)

(52) U.S. Cl.
CPC ............... *A45C 11/00* (2013.01); *A45F 5/00* (2013.01); *G10K 11/002* (2013.01); *G10K 11/18* (2013.01);

(Continued)

(58) Field of Classification Search
CPC ........ H04M 1/035; H04M 1/19; H04M 1/20; H04B 1/3888; A45C 2011/002
USPC ................ 181/198, 200, 205; 379/451, 454; 361/679.02, 679.09, 679.55, 679.56; 455/575.1
See application file for complete search history.

(56) References Cited

U.S. PATENT DOCUMENTS 2,392,787 A    1/1946  Edmond
3,023,885 A    3/1962  Kindseth (Continued)

FOREIGN PATENT DOCUMENTS

JP    H0818637 A    6/1994
JP    2001061530 A    3/2001

(Continued)

OTHER PUBLICATIONS

International Search Report Mailed Oct. 2, 2014; for Application No. PCT/US2014/041418.

*Primary Examiner* — Jeremy Luks

(57) ABSTRACT

A removable case for an electronic device may have an acoustic isolation mechanism between the removable case and an acoustic component on the electronic device. The acoustic isolation mechanism may be a compressible component that may provide an acoustic seal between an inner surface of the removable case and an exterior surface of the electronic device, and may include a waterproof acoustic membrane. The waterproof membrane prevents the entry of water while reacting to sound pressure changes to acoustically couple the electronic device with sounds outside the case. The acoustic isolation mechanism may be constructed of several different materials and several different manufacturing processes.

25 Claims, 17 Drawing Sheets

Related U.S. Application Data is a continuation of application No. 13/911,317, filed on Jun. 6, 2013, now Pat. No. 8,714,299, which is a continuation of application No. 12/950,821, filed on Nov. 9, 2010, now Pat. No. 8,479,875.

(60) Provisional application No. 61/262,848, filed on Nov. 19, 2009.

(51) Int. Cl.

| | | |
|---|---|---|
| *G10K 11/18* | (2006.01) | |
| *H04B 1/3888* | (2015.01) | |
| *H04M 1/03* | (2006.01) | |
| *H04M 1/19* | (2006.01) | |
| *H04M 1/20* | (2006.01) | |
| *A45F 5/00* | (2006.01) | |
| *G10K 11/00* | (2006.01) | |
| *H05K 5/02* | (2006.01) | |
| *H05K 5/03* | (2006.01) | |
| *H05K 5/06* | (2006.01) | |

(52) U.S. Cl.
CPC ........... *H04B 1/3888* (2013.01); *H04M 1/035* (2013.01); *H04M 1/19* (2013.01); *H04M 1/20* (2013.01); *H05K 5/0217* (2013.01); *H05K 5/03* (2013.01); *H05K 5/068* (2013.01); *A45C 2011/002* (2013.01); *A45C 2011/003* (2013.01)

(56) References Cited

U.S. PATENT DOCUMENTS

| | | |
|---|---|---|
| 3,590,988 A | 7/1971 | Hollar |
| 4,326,102 A | 4/1982 | Culp et al. |
| 4,352,968 A | 10/1982 | Pounds |
| 4,703,161 A | 10/1987 | McLean |
| 4,733,776 A | 3/1988 | Ward |
| 4,736,418 A | 4/1988 | Steadman |
| 4,762,227 A | 8/1988 | Patterson |
| 4,836,256 A | 6/1989 | Meliconi |
| 4,901,852 A | 2/1990 | King |
| 5,025,921 A | 6/1991 | Gasparaitis et al. |
| 5,092,458 A | 3/1992 | Yokoyama |
| 5,092,459 A | 3/1992 | Uljanic et al. |
| 5,123,044 A | 6/1992 | Tate |
| 5,175,873 A | 12/1992 | Goldenberg et al. |
| 5,230,016 A | 7/1993 | Yasuda |
| 5,360,108 A | 11/1994 | Alagia |
| 5,368,159 A | 11/1994 | Doria |
| 5,386,084 A | 1/1995 | Risko |
| 5,388,692 A | 2/1995 | Withrow et al. |
| 5,499,713 A | 3/1996 | Huffer |
| 5,625,688 A | 4/1997 | Ford et al. |
| 5,648,757 A | 7/1997 | Vernace et al. |
| 5,681,122 A | 10/1997 | Burke |
| 5,828,012 A | 10/1998 | Repolle et al. |
| 5,850,915 A | 12/1998 | Tajima |
| 5,923,752 A | 7/1999 | McBride et al. |
| 6,031,524 A | 2/2000 | Kunert |
| 6,041,924 A | 3/2000 | Tajima |
| 6,049,813 A | 4/2000 | Danielson et al. |
| 6,068,119 A | 5/2000 | Derr et al. |
| 6,082,535 A | 7/2000 | Mitchell |
| 6,094,785 A | 8/2000 | Montgomery et al. |
| 6,201,867 B1 | 3/2001 | Koike |
| 6,215,474 B1 | 4/2001 | Shah |
| 6,239,968 B1 | 5/2001 | Kim et al. |
| 6,273,252 B1 | 8/2001 | Mitchell |
| 6,301,100 B1 | 10/2001 | Iwata |
| 6,313,982 B1 | 11/2001 | Hino |
| 6,317,313 B1 | 11/2001 | Mosgrove et al. |
| 6,388,877 B1 | 5/2002 | Canova, Jr. et al. |
| 6,415,138 B2 | 7/2002 | Sirola et al. |
| 6,445,577 B1 | 9/2002 | Madsen et al. |
| 6,456,487 B1 | 9/2002 | Hetterick |
| 6,471,056 B1 | 10/2002 | Tzeng |
| 6,512,834 B1 | 1/2003 | Banter et al. |
| 6,519,141 B2 | 2/2003 | Tseng et al. |
| 6,536,589 B2 | 3/2003 | Chang |
| 6,617,973 B1 | 9/2003 | Osterman |
| 6,646,864 B2 | 11/2003 | Richardson |
| 6,659,274 B2 | 12/2003 | Enners |
| 6,665,174 B1 | 12/2003 | Derr et al. |
| 6,701,159 B1 | 3/2004 | Powell |
| 6,731,913 B2 | 5/2004 | Humphreys et al. |
| 6,839,430 B2 | 1/2005 | Kwak |
| 6,926,141 B2 | 8/2005 | Montler |
| 6,932,187 B2 | 8/2005 | Banter et al. |
| 6,950,516 B2 | 9/2005 | Laaksonen et al. |
| 6,954,405 B2 | 10/2005 | Polany et al. |
| 6,962,454 B1 | 11/2005 | Costello |
| 6,980,777 B2 | 12/2005 | Shepherd et al. |
| 6,995,976 B2 | 2/2006 | Richardson |
| 7,054,441 B2 | 5/2006 | Pletikosa |
| 7,061,762 B2 | 6/2006 | Canova, Jr. et al. |
| 7,069,063 B2 | 6/2006 | Halkosaari et al. |
| 7,146,701 B2 | 12/2006 | Mahoney et al. |
| 7,158,376 B2 | 1/2007 | Richardson et al. |
| 7,180,735 B2 | 2/2007 | Thomas et al. |
| 7,194,291 B2 | 3/2007 | Peng |
| 7,230,823 B2 | 6/2007 | Richardson et al. |
| 7,236,588 B2 | 6/2007 | Gartrell |
| 7,255,228 B2 | 8/2007 | Kim |
| 7,290,654 B2 | 11/2007 | Hodges |
| 7,312,984 B2 | 12/2007 | Richardson et al. |
| 7,341,144 B2 | 3/2008 | Tajiri et al. |
| 7,343,184 B2 | 3/2008 | Rostami |
| 7,400,917 B2 | 7/2008 | Wood et al. |
| 7,409,148 B2 | 8/2008 | Takahashi et al. |
| 7,418,278 B2 | 8/2008 | Eriksson et al. |
| 7,428,427 B2 | 9/2008 | Brunstrom et al. |
| 7,436,653 B2 | 10/2008 | Yang et al. |
| 7,449,650 B2 | 11/2008 | Richardson et al. |
| 7,495,895 B2 | 2/2009 | Carnevali |
| 7,555,325 B2 | 6/2009 | Goros |
| 7,558,594 B2 | 7/2009 | Wilson |
| 7,594,576 B2 | 9/2009 | Chen et al. |
| 7,609,512 B2 | 10/2009 | Richardson et al. |
| 7,623,898 B2 | 11/2009 | Holmberg |
| 7,663,878 B2 | 2/2010 | Swan et al. |
| 7,663,879 B2 | 2/2010 | Richardson et al. |
| 7,688,580 B2 | 3/2010 | Richardson et al. |
| 7,854,434 B2 | 12/2010 | Heiman et al. |
| 7,933,122 B2 | 4/2011 | Richardson et al. |
| 8,112,130 B2 | 2/2012 | Mittleman et al. |
| 8,342,325 B2 | 1/2013 | Rayner |
| 8,531,834 B2 | 9/2013 | Rayner |
| 2001/0048586 A1 | 12/2001 | Itou et al. |
| 2002/0009195 A1 | 1/2002 | Schon |
| 2002/0065054 A1 | 5/2002 | Humphreys et al. |
| 2002/0071550 A1 | 6/2002 | Pletikosa |
| 2002/0079244 A1 | 6/2002 | Kwong |
| 2002/0086702 A1 | 7/2002 | Lai et al. |
| 2002/0101707 A1 | 8/2002 | Canova et al. |
| 2002/0137475 A1 | 9/2002 | Shou et al. |
| 2002/0193136 A1 | 12/2002 | Halkosaari et al. |
| 2003/0151890 A1 | 8/2003 | Huang et al. |
| 2004/0014506 A1 | 1/2004 | Kemppinen |
| 2005/0279661 A1 | 12/2005 | Hodges |
| 2006/0124482 A1 | 6/2006 | Hodges |
| 2006/0226039 A1 | 10/2006 | Goradesky |
| 2006/0255493 A1 | 11/2006 | Fouladpour |
| 2006/0279924 A1 | 12/2006 | Richardson et al. |
| 2007/0071423 A1 | 3/2007 | Fantone et al. |
| 2007/0115387 A1 | 5/2007 | Ho |
| 2007/0158220 A1 | 7/2007 | Cleereman et al. |
| 2007/0297149 A1 | 12/2007 | Richardson et al. |
| 2008/0041896 A1 | 2/2008 | Holmberg |
| 2008/0083631 A1 | 4/2008 | Tsang et al. |
| 2008/0096620 A1 | 4/2008 | Lee et al. |
| 2008/0316687 A1 | 12/2008 | Richardson et al. |
| 2009/0009945 A1 | 1/2009 | Johnson et al. |
| 2009/0247244 A1 | 10/2009 | Mittleman et al. |

(56) References Cited

U.S. PATENT DOCUMENTS

| | | |
|---|---|---|
| 2009/0283184 A1 | 11/2009 | Han |
| 2010/0093401 A1 | 4/2010 | Moran et al. |
| 2010/0093412 A1 | 4/2010 | Serra et al. |
| 2010/0096284 A1 | 4/2010 | Bau |
| 2010/0104814 A1 | 4/2010 | Richardson et al. |
| 2010/0122756 A1 | 5/2010 | Longinotti-Buitoni |
| 2010/0203931 A1 | 8/2010 | Hynecek et al. |
| 2011/0157800 A1 | 6/2011 | Richardson et al. |
| 2013/0063004 A1 | 3/2013 | Lai et al. |
| 2013/0156218 A1 | 6/2013 | Annacone et al. |
| 2013/0334071 A1 | 12/2013 | Carnevali |
| 2014/0294217 A1 | 10/2014 | Yamaguchi et al. |

FOREIGN PATENT DOCUMENTS

| | | |
|---|---|---|
| WO | 2011114188 A1 | 9/2011 |
| WO | 2013027126 A2 | 2/2013 |

PROTECTIVE COVER WITH AN ACOUSTIC ISOLATION MECHANISM

CROSS-REFERENCE TO RELATED APPLICATIONS

This patent application is a continuation of U.S. patent application Ser. No. 14/289,521, filed May 28, 2014 (now allowed); which is a continuation-in-part of U.S. patent application Ser. No. 14/218,662, filed Mar. 18, 2014; which is a continuation of U.S. patent application Ser. No. 13/911,317, filed Jun. 6, 2013 (now U.S. Pat. No. 8,714,299); which is in turn a continuation of U.S. patent application Ser. No. 12/950,821, filed Nov. 19, 2010 (now U.S. Pat. No. 8,479,875); which claims the benefit of priority to U.S. Provisional Pat. App. No. 61/262,848, filed Nov. 19, 2009. The disclosures of each of the patents and applications cited in this paragraph are hereby incorporated by reference in their entireties.

BACKGROUND

Many handheld electronic devices may have acoustic components, such as speakers and microphones. Examples of such devices may be handheld cellular telephones, tablet computers, laptop computers, and other such devices. Such electronic devices are sensitive to water, liquids, dust, and other particulates that may be encountered by a user. Protective cases that provide waterproof protection are desired by users that wish to protect their electronic devices from damage. However, creating a waterproof barrier while simultaneously allowing clear sound detection by electronic device microphones can be problematic. While breathable, waterproof textiles (e.g. GORE-TEX) may be used, such materials require multiple layers and pieces for installation in a protective case.

Accordingly there is a need in the art for acoustic isolation components that are more simple to manufacture and can be installed in a protective case as a single unit.

SUMMARY

A removable case for a portable electronic device may have an acoustic isolation mechanism between the rigid removable case and an acoustic component on the electronic device. The acoustic isolation mechanism may be a compressible component that may provide an air seal between an interior surface of the removable case and an exterior surface of the electronic device. The acoustic isolation mechanism may be constructed of several different materials and several different manufacturing processes.

In one aspect, the instant technology provides a case for enclosing an electronic device, the case having an inner surface, an outer surface, and a sound aperture in the case. The sound aperture is positioned to be near an acoustic opening of the electronic device, such as a microphone or speaker, when the electronic device is installed in the case. The acoustic isolation mechanism is disposed on the inner surface of the case, proximate the acoustic opening of the electronic device. The acoustic isolation mechanism has an interior face oriented towards an interior of the case and an exterior face oriented towards an exterior of the case, with the exterior face contacting the inner surface of the case. At least one acoustic channel or acoustic path extends between the interior face and the exterior face of the acoustic isolation mechanism, and acoustically couples the electronic device and the sound aperture. The acoustic channel or channels each include at least one acoustic membrane that spans or covers a cross-section of the at least one acoustic channel or acoustic path. The acoustic isolation mechanism is molded from a waterproof elastomer. More than one acoustic channel and acoustic membrane may be used.

In some embodiments, an intentional gap exists between a sound aperture in the case and an acoustic opening of the electronic device when the electronic device is installed in the case. The case includes an acoustic isolation mechanism disposed at least in the intentional gap.

In certain embodiments of the foregoing aspect, the protective case is waterproof to a predetermined depth of water. In some embodiments, at least one pressure relief aperture is included, and each pressure relief aperture is covered by an air-permeable waterproof textile. The acoustic isolation mechanism may be formed-in-place in the intentional gap, or it may be adhered. The protective case may be formed from a rigid frame.

In another aspect, the instant technology provides an acoustic isolation mechanism having an interior face that can form an acoustic seal with an electronic device and an exterior face that can be attached to an inner surface of a protective cover for the electronic device. At least one acoustic channel or acoustic path extends from the interior face to the exterior face of the acoustic isolation mechanism that acoustically couples the electronic device to a sound opening in a protective case for the electronic device. The interior face that can form an acoustic seal with an electronic device and an exterior face that can be attached to an inner surface protective cover for the electronic device. The acoustic isolation mechanism also includes at least one acoustic membrane that spans or covers a cross-section of the at least one acoustic channel or acoustic path.

In some embodiments of either of the foregoing aspects, the acoustic isolation mechanism may be molded from a waterproof elastomer. In some embodiments, the acoustic membrane may be positioned proximate the interior face of the acoustic isolation mechanism. The acoustic membrane may include a material selected from: a breathable, waterproof textile and a waterproof elastomer. In some embodiments, the acoustic membrane is molded from the waterproof elastomer of the acoustic isolation mechanism. One or more structures may be molded into the acoustic membrane, including structures such as arches, domes, cones, accordion pleats, side pleats, and box pleats. In some embodiments, the one or more acoustic channels or paths may include a ledge to which the one or more acoustic membranes are coupled (e.g. by adhesive or by bonding).

In certain embodiments of either of the foregoing aspects, a plane of the at least one acoustic membrane transects the at least one acoustic channel at an angle of about 90 degrees relative to a central longitudinal axis of the at least one acoustic channel. In some embodiments, a plane of the at least one acoustic membrane transects the acoustic channel at an angle less than about 90 degrees and more than about 0.1 degrees relative to a central longitudinal axis of the at least one acoustic channel.

In some embodiments of either of the foregoing aspects, the acoustic isolation mechanism further comprises at least one counterbore on the interior face proximate the at least one acoustic channel or path. The acoustic membrane may cover or span a cross-sectional area of counterbore. In some embodiments, the counterbore may have a second counterbore inside its circumference that provides a ledge for attaching the acoustic membrane.

In some embodiments of either of the foregoing aspects, the interior face of the acoustic isolation mechanism includes a plurality of acoustic sealing walls proximate the at least one acoustic channel or acoustic path.

In yet another aspect, the present technology provides a case for enclosing the electronic device, the case having a rigid frame with an inner surface, an outer surface, and a cavity in the rigid frame positioned proximate at least one sound aperture in the rigid frame. The sound aperture is proximate an acoustic opening of the electronic device when the electronic device is installed in the case. The case includes a sound transmission apparatus disposed at least partially in the cavity of the rigid frame. The sound transmission apparatus includes an acoustic isolation mechanism having an interior face oriented towards the interior of the case and an exterior face that contacts the inner surface of the case. The sound transmission apparatus also includes at least one acoustic channel or path extending from the interior face to the exterior face of the acoustic isolation mechanism, the acoustic channel or path acoustically coupling the acoustic opening of the electronic device with the sound aperture. At least one acoustic membrane extends from the external face of the acoustic isolation mechanism to an anchor knob, forming a truncated cone structure. The anchor knob of the sound transmission apparatus is coupled to the inner surface of the case.

Some embodiments of the protective cover with a sound transmission apparatus include a stability member extending from the anchor knob into the interior of the cone. The stability member has a truncated cone structure that does not touch the acoustic membrane unless subjected to sufficient water pressure.

In certain embodiments, the acoustic isolation mechanism and the acoustic membrane form a truncated pyramid having at least three sides. The acoustic isolation mechanism and the acoustic membrane may be molded from a waterproof elastomer. In some embodiments, the anchor knob may also be molded from the same waterproof elastomer as that of the acoustic isolation mechanism and acoustic membrane.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1:
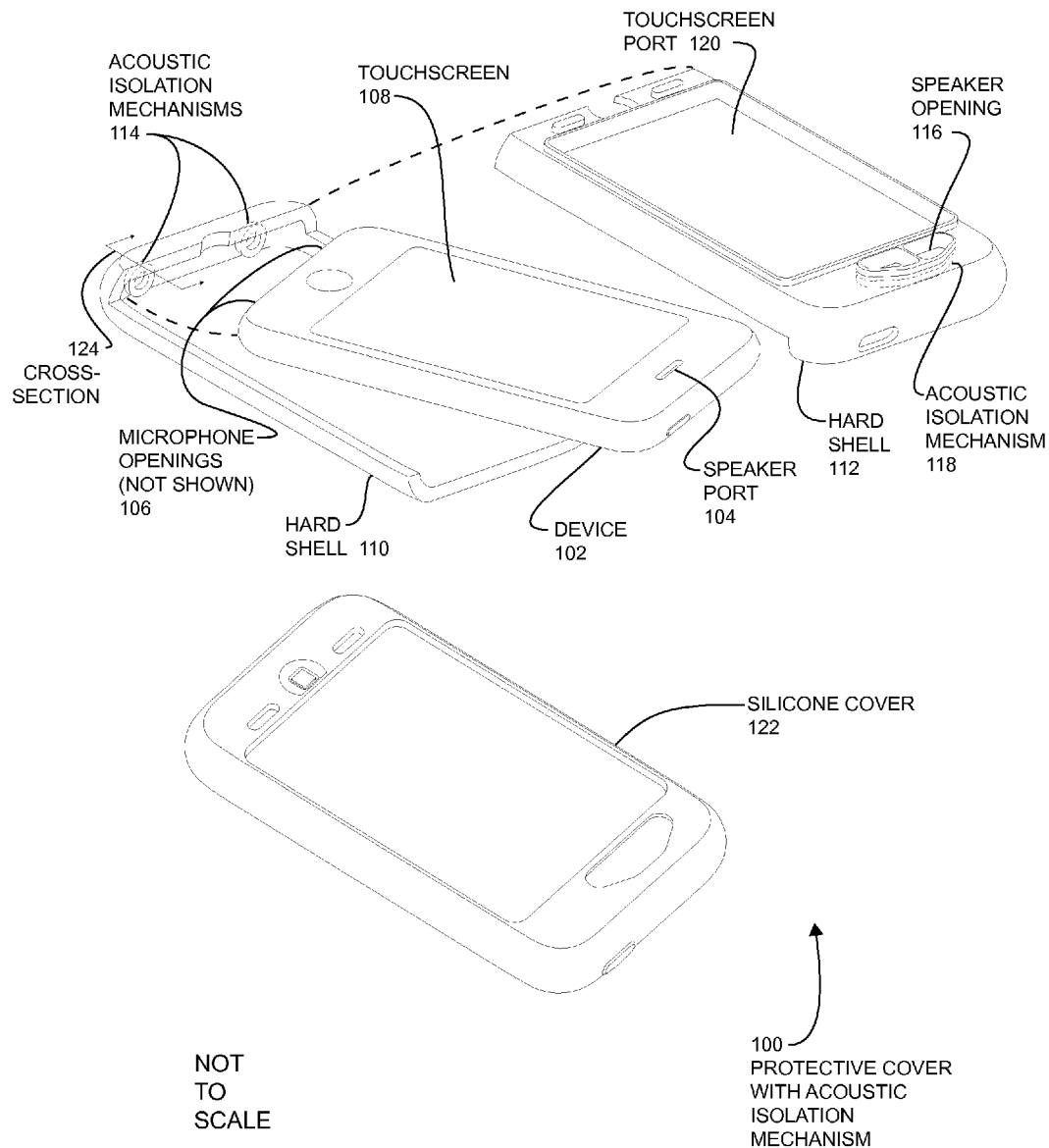
FIG. 1 is a perspective illustration of an embodiment showing a device with a protective cover having an acoustic isolation mechanism.

An acoustic isolation device may be placed between an electronic device and a hard shell cover. The acoustic isolation device may form an air passageway between an opening in the hard shell cover to a corresponding opening in the electronic device through which sound may pass to an audio component, which may be a speaker or microphone.

As used herein, the term "about" in quantitative terms refers to plus or minus 10% of that value. For example: "about 15 mm" would encompass plus or minus 1.5 mm (from 13.5 mm to 16.5 mm inclusive); "about 3 mm" would encompass plus or minus 0.3 mm (from 2.7 mm to 3.3 mm). When used with a percentage, the term "about" refers to plus or minus 10%. For example, "about 30%" would encompass 10-20% and "about 80%" would encompass 70-90%, inclusive. Moreover, where "about" is used herein in conjunction with a quantitative term, it is understood that in addition to the value plus or minus 10%, the exact value of the quantitative term is also contemplated and described. For example, the term "about 1 mm" expressly contemplates, describes, and includes exactly 1 mm.

The acoustic isolation device may be manufactured from various types of compressible materials, such as open cell and closed cell foams, thermoplastic elastomers, and other pliable materials. In some embodiments, the acoustic isolation device may be separately manufactured and attached to a hard shell cover using adhesives or other bonding methods. In other embodiments, the acoustic isolation device may be molded onto the hard shell case using a two-shot molding technique or secondary molding process. In still other embodiments, the acoustic isolation device may be incorporated into a removable component that may wrap the hard shell case.

The acoustic isolation device may provide several functions. In some embodiments, the acoustic isolation device may provide an airtight seal between the hard shell cover and the device inside the cover. The airtight seal may enhance acoustics by preventing echoes or other acoustic noise between the hard shell cover and the device.

In some embodiments, the acoustic isolation device may take up slack between the device and the hard shell cover, preventing the device from shifting within the cover and potentially reducing rattling of the device inside the cover, or other acoustic noise.

In some embodiments, the acoustic isolation device may dampen vibrations in the hard shell case that may cause acoustic noise by reducing acoustical feedback. The feedback may be reduced by preventing acoustical energy from travelling between a hard shell and a device. Without the acoustic isolation mechanism, acoustic energy from a speaker in the device may cause the hard shell to resonate and degrade audio quality. In the case of a microphone, the acoustic isolation mechanism may reduce ambient acoustic noise that may be gathered by the hard shell and transmitted from the hard shell into a microphone, adding unwanted noise to the acoustic signal.

Throughout this specification, like reference numbers signify the same elements throughout the description of the figures.

When elements are referred to as being "connected" or "coupled," the elements can be directly connected or coupled together or one or more intervening elements may also be present. In contrast, when elements are referred to as being "directly connected" or "directly coupled," there are no intervening elements present.

FIG. 1 is a perspective view of an embodiment 100, showing a device with a protective cover. Embodiment 100 is merely one example of a two-piece hard shell case that may have an acoustic isolation mechanism.

Embodiment 100 is an example of a device 102 with a protective cover. The device 102 may be a cellular telephone, a smartphone, an audio player, a video player, a personal digital assistant, a camera, a portable instrument, a barcode scanner, a laptop computer, a tablet computer, or any other device.

In many embodiments, the protective cover may be a supplemental cover for a commercial product. The supplemental cover may be an aftermarket cover that a user may install after purchasing an electronic device or other item that may be covered. In many embodiments, such aftermarket covers may be installed and removed by a user.

Many embodiments may operate as protective covers that may insulate a device from physical damage, including mechanical abrasion such as scratches, as well as damage from dropping or other physical trauma. Some embodiments may provide protection from water, including some embodiments that may be waterproof to some depth of water.

Some embodiments may operate as aesthetic or decorative enhancements to allow a user to personalize their device. In such embodiments, the various components of a protective case may be designed with aesthetic or decorative elements, or may be manufactured with different colors, designs, or textures.

Some embodiments may provide various additional components that may not be available with a stock device. For example, a protective case may have a belt loop holder which may be integrated into the protective case or may have features that engage a carrier or holder of some sort.

Throughout this specification, the term "protective case" is used to describe a case or cover that comprises a rigid component and a flexible component. The adjective "protective" is merely used as a descriptor for the case and is not meant to be limiting in any manner. For example, some embodiments may provide very little, if any, protection from physical trauma. In some instances, a protective case may protect against the intrusion of water. While water protection is beneficial to a user, it can lead to difficulty with the encased device's ability to receive sound from outside the protective case. Acoustic isolation mechanisms that incorporate a waterproof membrane as described herein can simultaneously reduce feedback issues with sound passing through the case, and prevent entry of water or other liquids.

In embodiments where a user may install the protective case, the components of the protective case may be designed to be removable. Such embodiments may provide mechanisms for the protective case components to snap together or otherwise engage each other, as well as a removable flexible component.

In embodiments where a case may be installed in a permanent or semi-permanent fashion, the case components may be assembled using adhesives, ultrasonic welding, snap fits, or other mechanisms. In some embodiments that are installed in a permanent manner, a flexible component may be formed by injection molding the flexible component directly to the rigid component. Some such embodiments may be manufactured using a two-shot molding process.

A cover for the device 102 may have a rigid component, a flexible component, or both rigid and flexible components. The rigid component may be a rigid component that may be designed in two or more pieces in some designs. The rigid component may be manufactured from various injection molded thermoplastics, thermoset plastics, composites, metals, or other materials. The rigid component may include a flexible component that is overmolded on the interior or exterior of the rigid component. The flexible component may be manufactured from a flexible, stretchable material and may be designed to wrap around the rigid component on several sides. Some embodiments may use a molded silicone, for example, which may stretch to allow installation and may wrap around several sides of a device to stay in place.

In the example of embodiment 100, two hard shells 110 and 112 may snap or fit together to produce a rigid cover that encapsulates the device 102. Hard shell 110 may fit against the rear contour of the device 102, and the hard shell 112 may fit against the front contour of the device 102.

The hard shells 110 and 112 may be designed to contact the device 102 in specific areas or surfaces to minimize rattling or shifting between the device 102 and the assembled hard shell case. In some embodiments, the hard shells 110 and 112 may be designed to follow the contour of the device 102 with some assembly and manufacturing tolerance for a slight slip fit or, in some instances, a slight interference fit. Some embodiments may be designed with an interference fit which may slightly stress the assembled hard shell. Such embodiments may be useful to minimize shifting between the hard shell and the device.

In embodiments where a slip fit or intentional gap is designed between the hard shell and the device, one or more acoustic isolation mechanisms may be used to take up any gaps. Such embodiments may allow for larger manufacturing tolerances in the hard shell cover while still providing adequate protection and minimizing shifting or rattling of the device.

The device 102 (which may be a cellular telephone, personal digital assistant, or other device) is illustrated with a touchscreen 108, which may represent. The touchscreen 108 may be activated and used through the touchscreen port 120, which may or may not have a transparent film. In some embodiments, the touchscreen port 120 may be an opening so that a user may directly contact the touchscreen 108.

The case may have a hard shell over which a silicone cover 122 may be assembled. The silicone cover 122 may be stretched to surround the hard shell. In some embodiments, portions of the hard shell may be exposed through the silicone cover 122.

In some embodiments, the silicone cover 122 may include features that serve as an acoustic isolation device. An example of such an embodiment may be illustrated in embodiment 600 presented later in this specification.

The device 102 may be representative of a cellular phone, and may have a speaker port 104 and one or more microphone openings 106. The device 102 may have a speaker component and microphone components inside the device's exterior case, which may have ports or openings through which sound may travel. In some embodiments, the device 102 may use acoustic pipes or other mechanisms for transferring acoustic energy between the exterior of the device 102 and the acoustic component within the device.

The hard shell 110 is illustrated as having two acoustic isolation mechanisms 114 located in the bottom area of the hard shell 110. The acoustic isolation mechanisms 114 may correspond to and mate with the microphone openings 106 on the device 102.

The acoustic isolation mechanisms 114 may be constructed using several different manufacturing techniques and several different materials. Examples of different designs may be found later in this specification.

Similar to the microphones, the speaker port 104 of the device 102 may have an acoustic isolation device 118 to which the speaker port 104 may mate. The acoustic isolation device 118 may form a seal between the exterior surface of the device 102 and the interior surface of the hard shell 112 to form a channel for acoustic energy to travel. The acoustic energy may exit the hard shell 112 through the speaker opening 116.

Figure 2:
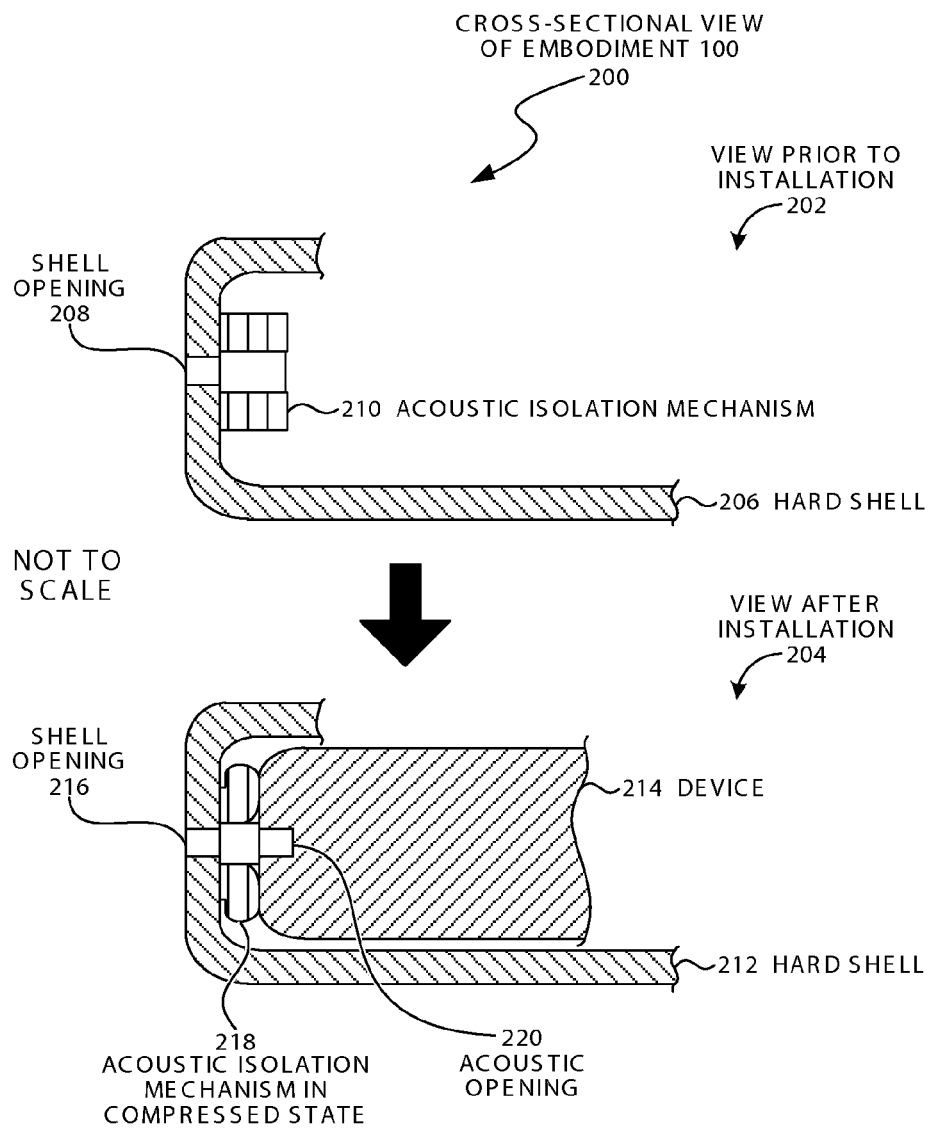
FIG. 2 is a cross-sectional illustration of an embodiment showing an acoustic isolation mechanism prior to and after installation.

FIG. 2 is a cross-sectional view of an embodiment 200 showing the acoustic isolation mechanisms 114, as per the cross section 124 of embodiment 100. Embodiment 200 is not to scale. The view 202 may represent the hard shell 206, the shell opening 208, and the acoustic isolation mechanism 210 prior to installing the device.

The view 204 may illustrate the hard shell 212 with the device 214 installed. During installation, the acoustic isolation device 218 may be compressed to form a seal to the device 214 in the area around the acoustic opening 220. The acoustic isolation mechanism 218 may form a passageway so that acoustic energy may pass between the shell opening 216 and the device's acoustic opening 220.

In many embodiments, an acoustic isolation mechanism may form a seal against the exterior surface of the device. The seal may be an airtight seal in some embodiments, while in other embodiments, the seal may not be airtight. In the case of an airtight seal, the acoustic isolation mechanism may be an annular ring or other shape that completely surrounds the acoustic opening 220 and the shell opening 216. In the case of a seal that may not be airtight, the acoustic isolation mechanism may only partially surround the acoustic opening 220 and the shell opening 216.

The compression of the acoustic isolation mechanisms may provide some internal force to push the device towards the right in the figure. The internal force may take up any extra space, designed-in gaps, and manufacturing tolerances within the assembled hard shell case. The internal force may minimize shifting or rattling of the device.

Figure 3:
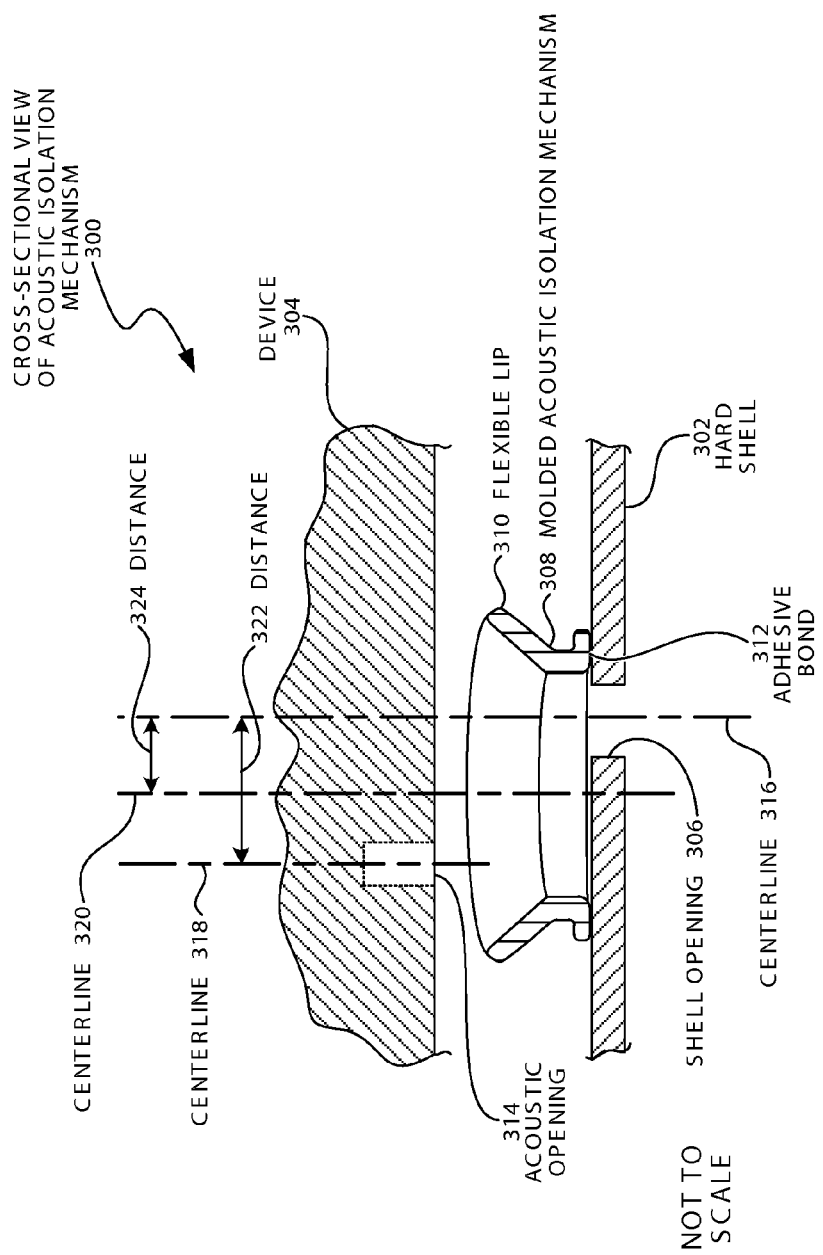
FIG. 3 is a cross-sectional illustration of an embodiment showing a first embodiment of an acoustic isolation mechanism.

FIG. 3 is a cross-sectional view of an embodiment 300 showing another acoustic isolation mechanism. Embodiment 300 is not to scale. Embodiment 300 may illustrate a flexible gasket type acoustic isolation mechanism that may be molded of silicone rubber or other thermoplastic elastomer. Embodiment 300 further illustrates an example where the acoustic opening in a device may be offset from the shell opening, and the acoustic isolation mechanism may seal the gap between the two openings.

A hard shell 302 and a device 304 may be illustrated in close proximity but prior to being fully installed. When fully installed, the device 304 may be in contact with the molded acoustic isolation mechanism 308 such that the flexible lip 310 may deform and create a seal against the device 304.

The acoustic isolation mechanism 308 may have a lower surface that may be attached to the hard shell 302 through an adhesive bond 312. The adhesive bond 312 may be made with a pressure sensitive adhesive, epoxy, cyanoacrylate, or other type of adhesive. In some embodiments, the acoustic isolation mechanism may be attached using ultrasonic welding or some other attachment mechanism.

Embodiment 300 illustrates an embodiment where the shell opening 306 may not be aligned with the acoustic opening 314 or the acoustic isolation mechanism 308. The shell opening 306 is illustrated as having a centerline 316, while the acoustic opening 314 is illustrated as having a centerline 318 and the acoustic isolation mechanism 308 is illustrated as having a centerline 320.

The distance 322 illustrates the offset from the acoustic opening 314 and the shell opening 306, and the distance 324 illustrates the offset from the acoustic isolation mechanism 308 to the shell opening 306.

In some embodiments, the distances 320 or 324 may be 0.010 in, 0.020 in, 0.050 in, or larger. In some embodiments, the distances 320 or 324 may be sized to account for various assembly or manufacturing tolerances.

Figure 4:
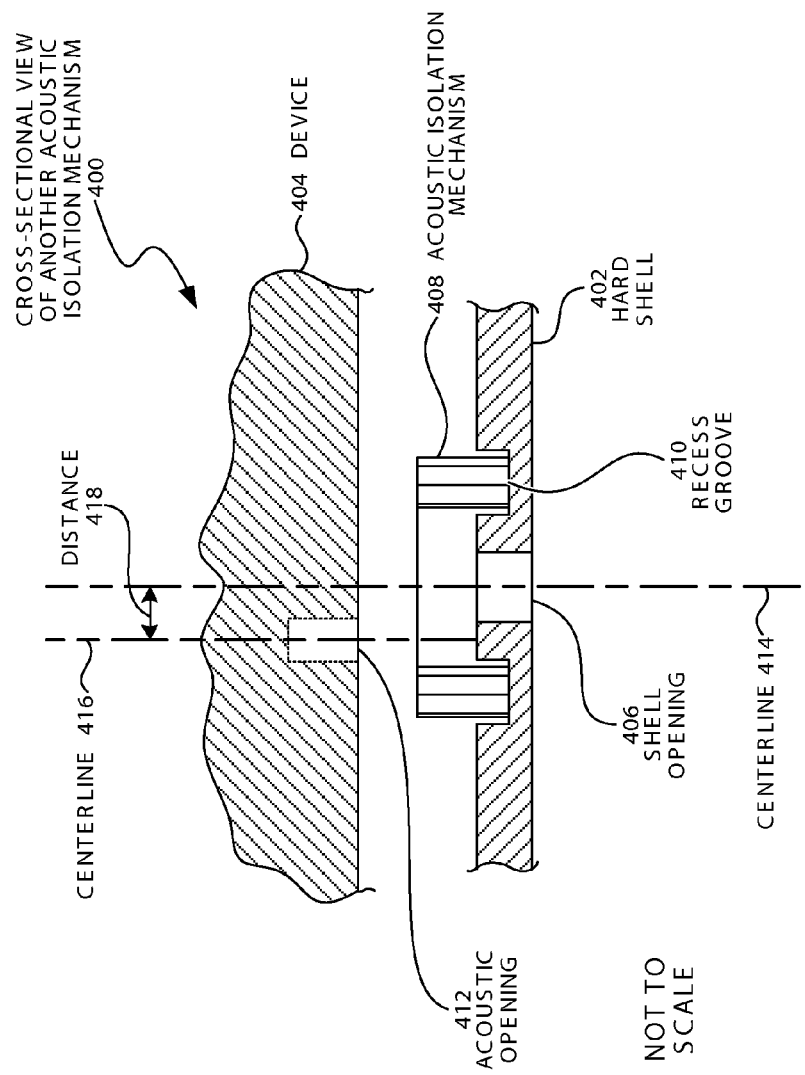
FIG. 4 is a cross-sectional illustration of an embodiment showing a second embodiment of an acoustic isolation mechanism.

FIG. 4 is a cross-sectional view of an embodiment 400 illustrating another example of an acoustic isolation mechanism. Embodiment 400 is not to scale. Embodiment 400 shows a hard shell 402 and a device 404 with an acoustic isolation mechanism 408, where the acoustic isolation mechanism may be formed by punching the shape from a foam or other compliant material. Embodiment 400 illustrates the hard shell 402 and device 404 in close proximity but prior to engaging into a fully assembled position.

The hard shell 402 may have a shell opening 406 that has a recess groove 410 in which the acoustic isolation mechanism 408 may be placed. The recess groove 410 may perform several functions in various embodiments. In some embodiments, the recess groove 410 may be wider than the acoustic isolation mechanism 408 and may allow for the acoustic isolation mechanism 408 to squeeze or deform into the groove 410, which may allow the device 404 to come closer to the hard shell 402 when fully assembled. In some embodiments, the recess groove 410 may serve as a manufacturing aid to guide an operator to the proper placement of the acoustic isolation mechanism 408.

The acoustic isolation mechanism 408 may be manufactured from stamping or die cutting a shape in a foam material. In many such embodiments, the foam layer may have an adhesive layer attached prior to die cutting. The acoustic isolation mechanism 408 may be attached by removing a backing material to expose the adhesive, then placing the acoustic isolation mechanism 408 in the recess groove 410.

The shell opening 406 may have a centerline 414 that may be offset by a distance 416 from a centerline 416 of the acoustic opening 412. In many embodiments, the distance 418 may be 0.010 in, 0.020 in, 0.050 in, or larger.

Figure 5:
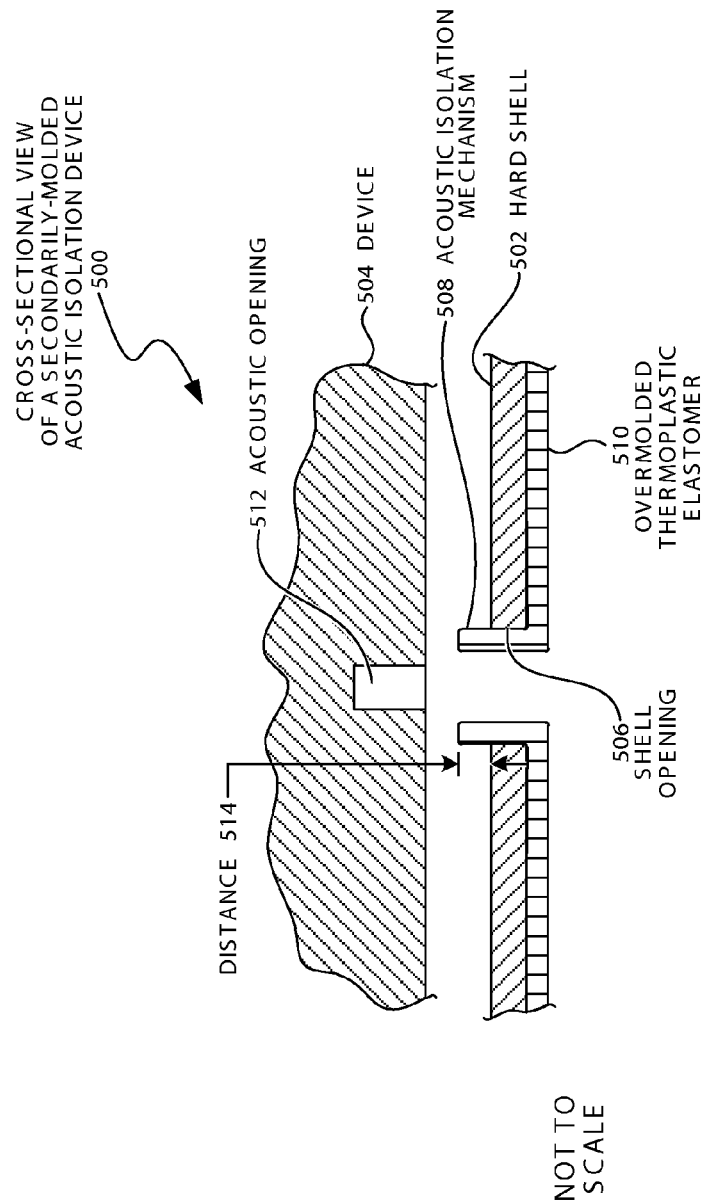
FIG. 5 is a cross-sectional illustration of an embodiment showing a third embodiment of an acoustic isolation mechanism.

FIG. 5 is a cross-sectional view of an embodiment 500 illustrating a formed-in-place acoustic isolation mechanism. Embodiment 500 is not to scale. Embodiment 500 illustrates an embodiment where a hard shell 502 may have an acoustic isolation mechanism 508 that may be formed in place to seal against a device 504. The hard shell 502 and device 504 are illustrated in close proximity, but not in the final assembled state. The final assembled state may be when the device 504 contacts and compresses the acoustic isolation mechanism 508.

Embodiment 500 illustrates a design where the acoustic isolation mechanism may be formed onto the hard shell 502 using a secondary molding process. In such a process, the hard shell 502 may be molded first, then the overmolded thermoplastic elastomer 510 may be molded directly onto the hard shell 502.

The design of the acoustic isolation mechanism 508 may be any shape that may seal against the device 504. In the case of embodiment 500, the thermoplastic elastomer 510 may be formed to extend inwards by a distance 514 to seal against the device 504 around the acoustic opening 512. The thermoplastic elastomer 510 may be formed into the shell opening 506.

Figure 6:
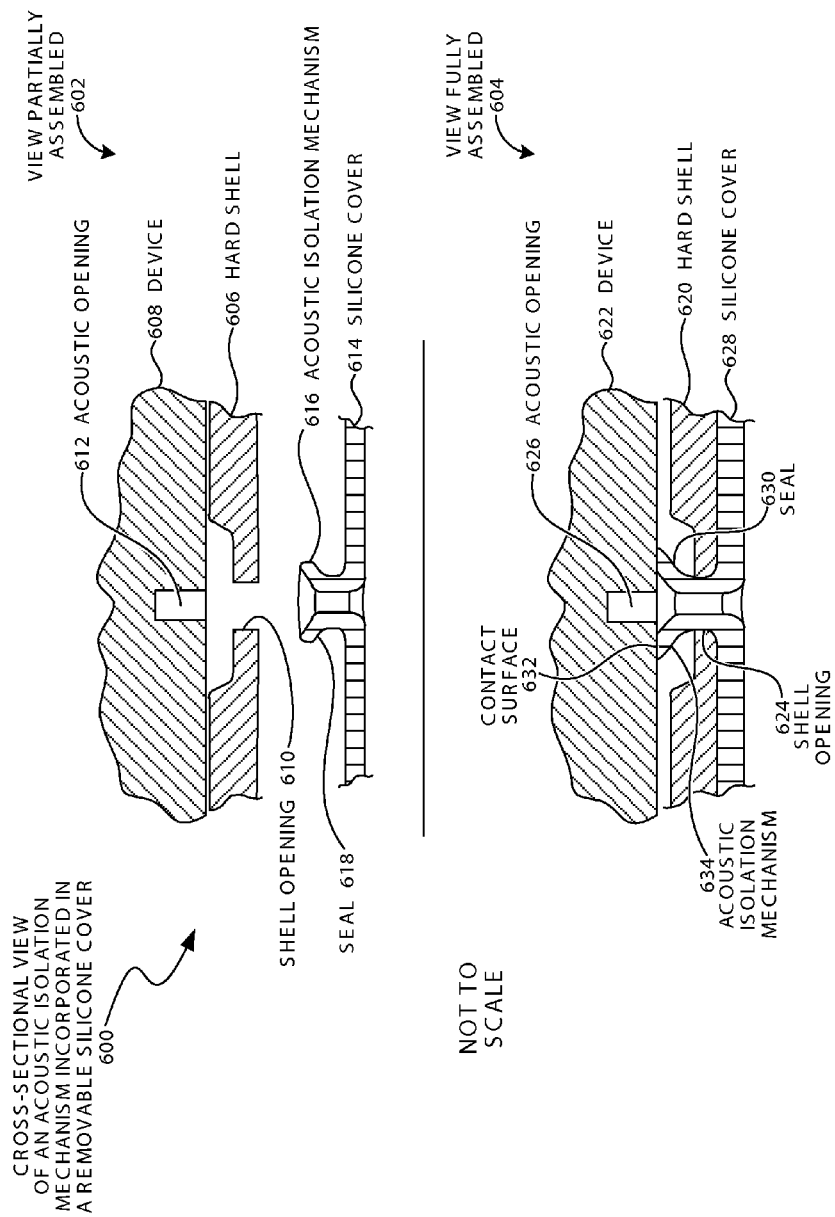
FIG. 6 is a cross-sectional illustration of an embodiment showing a fourth embodiment of an acoustic isolation mechanism.

FIG. 6 is a cross-sectional illustration of an embodiment 600 showing an acoustic isolation mechanism that may be incorporated into a removable silicone cover. Embodiment 600 is not to scale. Embodiment 600 illustrates a partially assembled view 602 and a fully assembled view 604.

In the partially assembled view 602, a hard shell 606 is shown installed onto a device 608. The shell opening 610 is approximately aligned with the acoustic opening 612. A silicone cover 614 may have a built-in acoustic isolation mechanism 616 that may have a flexible seal 618.

In the installation process, the hard shell 606 may be installed onto the device 608. The design of the hard shell 606 may be such that a gap or space may be available between the hard shell 606 and the device 608, and the device 608 may be loosely contained within the hard shell 606. In a typical embodiment, a two piece hard shell may enclose the device 608 using snap fits or other engagement mechanism. In a one piece hard shell embodiment, a single piece hard shell may engage the device by snapping or bending to fit over and capture the device.

As a second step in the installation process, the silicone cover 614 may be fitted over the hard shell 606 and the acoustic isolation mechanism 616 may be forced into the shell opening 610. As the acoustic isolation mechanism 616 is installed into the shell opening 610, the acoustic isolation mechanism 616 may form a seal to the surface of the device 608 and may also take up some slack or fill the gap between the hard shell 606 and the device 608.

The fully assembled view 604 may show the hard shell 620 installed onto the device 622, with the shell opening 624 aligned with the acoustic opening 626.

The acoustic isolation mechanism 634 of the silicone cover 628 may be forced into the shell opening 624, resulting in the seal 630 being pressed against the device 622 in the area of the contact surface 632. As shown in FIG. 6, the passageway within the acoustic isolation mechanism 634 can expand in width proximate the shell opening 624 or proximate the seal 630.

In some embodiments of acoustic isolation mechanisms, a waterproof membrane may be incorporated into the acoustic isolation mechanism, allowing installation of both the acoustic isolation mechanism and waterproof acoustic membrane as a single unit during assembly of a protective case. The waterproof acoustic membrane spans or covers the entire acoustic channel or acoustic path that passes through the acoustic isolation mechanism and allows sound to pass through the sound channel, while also preventing entry of water or liquids into the shell. The waterproof acoustic membrane has a low enough acoustic impedance (a low enough mass) to transmit sound through the membrane, while minimizing audio artifacts that could adversely affect sound quality of the mobile computing device while encased in the shell or encasement.

Figure 7A:
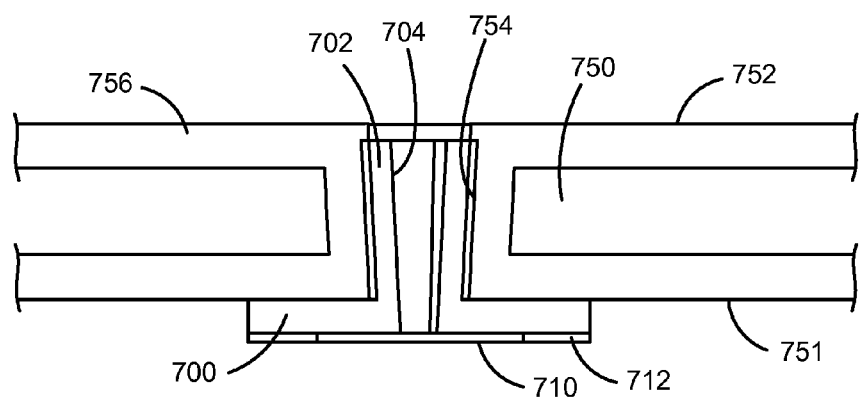
FIG. 7A is a cross-sectional illustration of an acoustic isolation mechanism that includes a waterproof acoustic membrane.
Figure 8A:
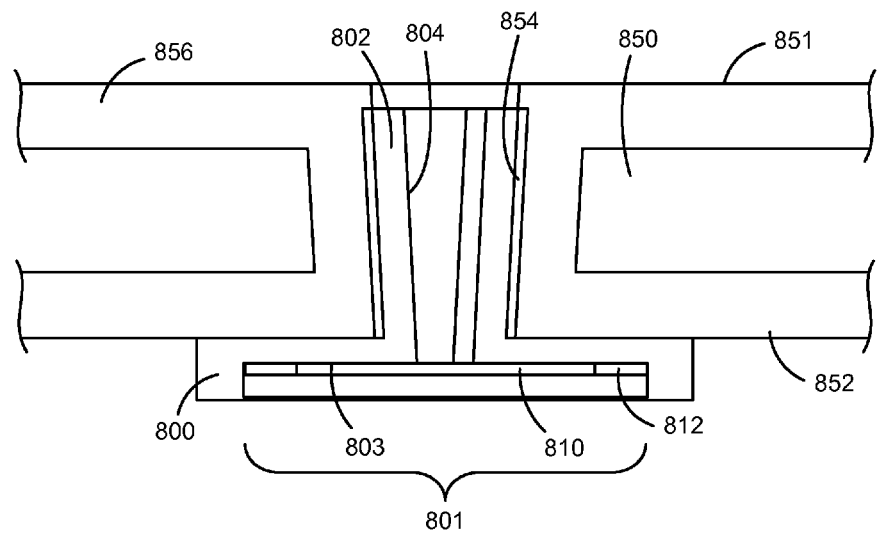
FIG. 8A is a cross-sectional illustration of another embodiment of an acoustic isolation mechanism that includes a waterproof acoustic membrane in a counterbore.

In some embodiments, the waterproof acoustic membrane may be a separate piece, such as a waterproof elastomer or breathable waterproof textile (e.g. GORE-TEX) that is installed on an interior surface of the acoustic isolation mechanism. The acoustic membrane extends across the cross-sectional area of the acoustic channel. In some embodiments, the acoustic membrane may include a textile that is breathable and water-resistant, or not water-resistant at all. For example, FIG. 7A shows a close-up sectional side view (not to scale) of an acoustic isolation mechanism 700 positioned proximate the interior surface 751 of a case wall 750. The acoustic isolation mechanism 700 includes an acoustic membrane 710 adhered to the acoustic isolation mechanism 700. Preferably, the acoustic membrane 710 is positioned as close as possible to the position of a microphone of the encased mobile device to minimize the amount of airspace between the membrane and the microphone. However, in some embodiments, the acoustic isolation mechanism may be constructed with a counterbore to retain the acoustic membrane, leaving an air gap between the outer surface of the mobile device and the acoustic membrane (see, e.g., FIG. 8 and related disclosure below). Regardless, the acoustic isolation mechanism 700 forms an acoustic seal between an electronic device (not shown) and the case wall 750, minimizing acoustic leakage and vibration between the case wall and the exterior of the electronic device.

Returning to FIG. 7A, the acoustic isolation mechanism is installed in a sound aperture 754 of a case wall 750, wherein the inner circumference of sound aperture 754 of case wall 750 and the outer circumference of sound channel member 702 are reciprocally tapered to insure that the acoustic isolation mechanism is retained in the sound aperture 754 when the mobile device is installed or removed. In the embodiment shown in FIG. 7A, the acoustic channel 704 of the acoustic isolation mechanism 700 terminates prior to reaching the exterior surface 752 of the case wall 750. In some embodiments, the end of the sound channel 704 is flush with the exterior perimeter of the case. The acoustic membrane 710 and the acoustic channel 704 provide a waterproof acoustic coupling between sounds outside the case and an electronic device microphone.

Figure 7B:
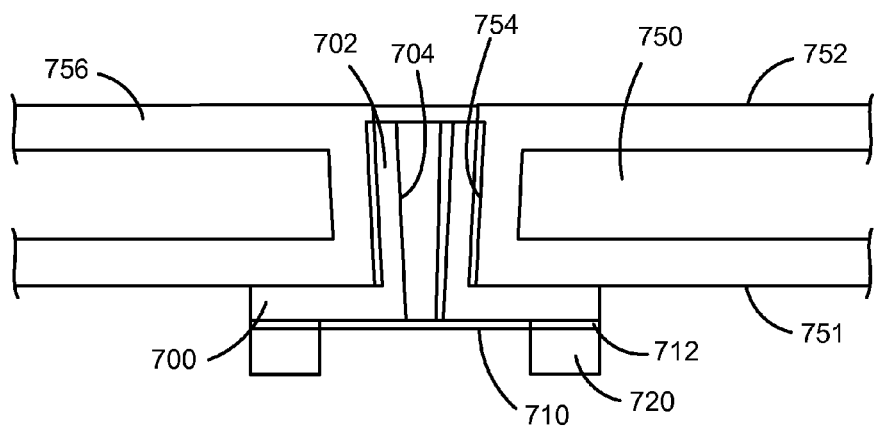
FIG. 7B is a cross-sectional illustration of another embodiment of an acoustic isolation mechanism that includes an additional waterproof acoustic membrane.

In other embodiments, as shown in FIG. 7B (not to scale), an additional annular compressible member 720 may be attached to the acoustic isolation mechanism proximate the acoustic membrane. FIGS. 7A and 7B also show an elastomeric overmold 756 that extends from the interior surface 751 of the case wall 750, along the inner circumference of sound aperture 754, and to the exterior surface 752 of the case wall 750. The elastomeric overmold 756 extends through the sound aperture and onto to the inner surface of the case in order to reduce structure-bound vibration that may be extant on the harder surface of the case itself and introduce noise to the acoustic membrane 700 of the acoustic isolation mechanism 700. In some embodiments, the overmold 756 may extend only over a portion of the inner surface 751 of case wall 750 that is proximate the sound aperture 754, and along the inner circumference of the sound aperture 754.

Figure 7C:
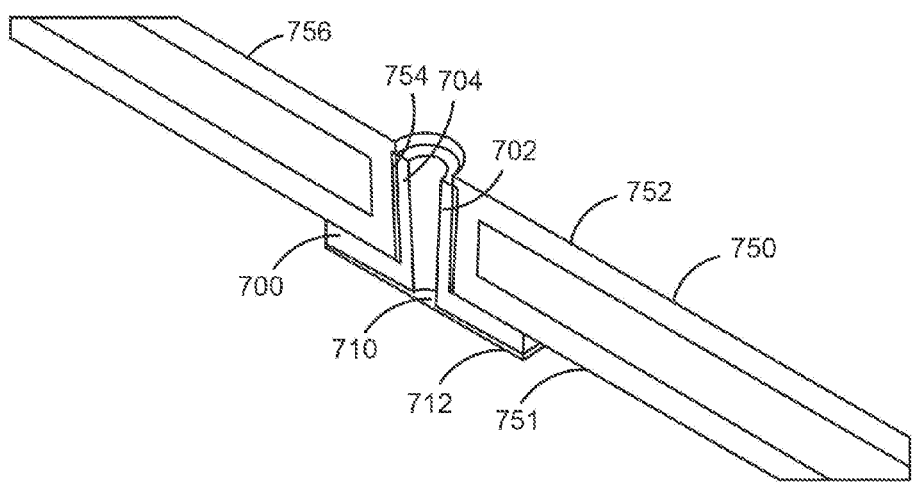
FIG. 7C is a cross-sectional perspective view of the acoustic isolation mechanism of FIG. 7A.

FIG. 7C shows a perspective sectional view (not to scale) of the acoustic isolation mechanism 700 of FIG. 7A inserted into a sound aperture 754 of a case wall 750. The sound aperture 754 is preferably proximate a microphone of a mobile electronic device that is secured within a protective case.

In some embodiments, the waterproof acoustic membrane may be a separate piece, such as a waterproof elastomer (e.g. silicone polymer) or breathable waterproof textile (e.g. GORE-TEX), that is attached or adhered to a ledge that is part of the inner circumference of a sound channel in the acoustic isolation mechanism. In the embodiment shown in FIG. 8A (not to scale), the acoustic isolation mechanism 800 has a sound channel member 802 with a sound or acoustic channel 804 that opens into a counterbore or cavity 801. The counterbore 801 provides a cavity surface 803 proximate the inner opening of the sound channel 804, allowing adhesion of acoustic membrane 810 via adhesive ring 812. In certain embodiments, a second counterbore (not shown) inside the circumference of counterbore 801 may provide a ledge for coupling an acoustic membrane, such that the acoustic membrane spans the second counterbore and is not inside acoustic channel 804. Similar to FIGS. 7A-C, in FIG. 8A sound channel member 802 is inserted into sound aperture 854 such that acoustic isolation mechanism is positioned on the interior surface 851 of case wall 850. Elastomeric coating 856 is overmolded or adhered to exterior surface 852, interior surface 851, and sound aperture 854 of case wall 850 in order to help isolate the case wall and other components from acoustic vibration.

Figure 8B:
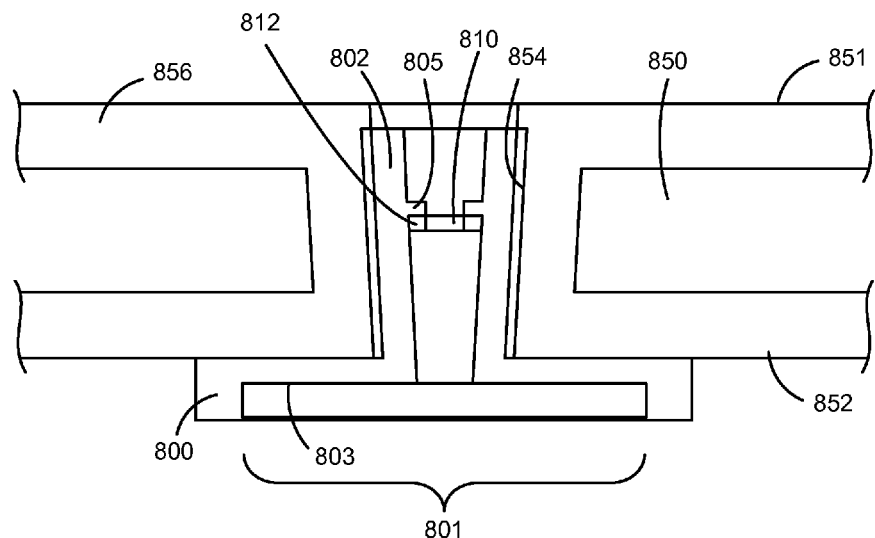
FIG. 8B is a cross-sectional illustration of yet another embodiment of an acoustic isolation mechanism with a waterproof acoustic membrane within a sound channel of the mechanism.

FIG. 8B depicts another embodiment of sound isolation mechanism 800 (not to scale). In this exemplary embodiment, a sound channel ledge 805 for retaining an acoustic membrane is positioned within sound channel 804 of sound channel member 802. Acoustic membrane 810 is adhered to sound channel ledge 805 by adhesive ring 812. In some embodiments, counterbore 801 may include a ledge similar to sound channel ledge 805 that allows installation of an acoustic membrane. In certain embodiments, the acoustic isolation mechanism 800 may include a second counterbore (not shown) inside the circumference of counterbore 801, providing a ledge for coupling an acoustic membrane, such that the acoustic membrane spans the second counterbore and is not inside acoustic channel 804.

In certain embodiments, the acoustic isolation mechanism may have two counterbores (second counterbore not shown) proximate both the inner end and outer of the sound channel (e.g. mirror images of each other), and at least one acoustic membrane may be attached or adhered to one of the cavity surfaces formed within each counterbore. The sound channel 804 may be cylindrical (e.g. right cylinder, elliptic cylinder, or oblique cylinder), cone-shaped (e.g. a right cone, an oblique cone, a double cone, or a bicone), uniform prism-shaped, non-uniform prism-shaped, spherical polyhedron-shaped, or combinations thereof. The sound channel may have tunnel-like curvature similar to that of a mammalian ear canal (e.g. a human, a bat, etc.). Similarly, the counterbore 801 may also be cylindrical, cone-shaped, uniform prism-shaped, non-uniform prism-shaped, spherical polyhedron-shaped, or combinations thereof, as well as having tunnel-like curvature similar to that of a mammalian ear canal.

In another embodiment of an acoustic isolation mechanism, the acoustic membrane is formed from the same material as the acoustic isolation mechanism, and is integral with an inner circumference of the acoustic/sound channel or acoustic path. For example, an acoustic isolation mechanism may be formed from a silicone elastomer using compression molding, such that a thin acoustic membrane made of silicone elastomer is also formed across an entire cross-sectional area of the sound channel. Preferably, the integral membrane is made as thin as possible, while having enough strength to resist rupture of the membrane from an internal or external pressure. Acoustic membranes may have an average thickness of: from about 0.01 mm to about 0.1 mm; from about 0.02 mm to about 0.08 mm; from about 0.04 mm to about 0.06 mm; from about 0.1 mm to about 0.3 mm.

Figure 9A:
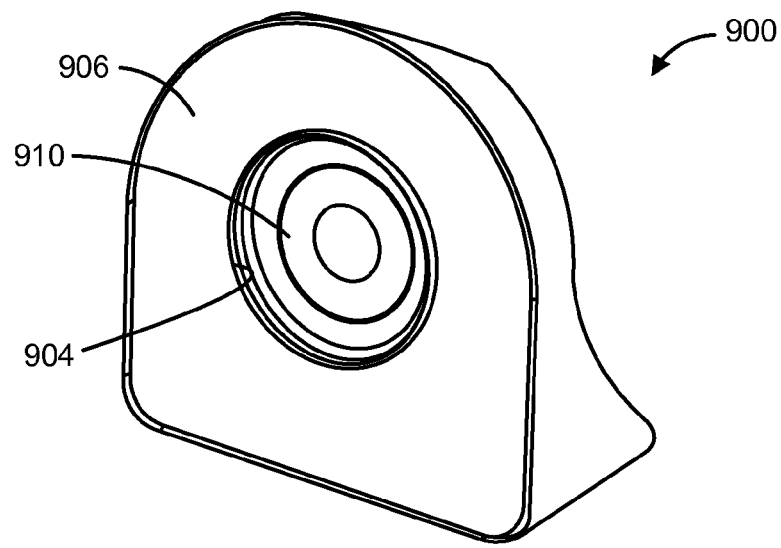
FIG. 9A is a perspective view of an embodiment of an acoustic isolation mechanism with an integral acoustic membrane.

FIG. 9A illustrates a perspective view of an exemplary acoustic isolation mechanism 900 that includes an integral acoustic membrane 910 positioned across a cross-sectional area of the acoustic/sound channel 904. In the particular embodiment shown in FIG. 9A, the acoustic isolation mechanism 900 is not configured with a sound channel member to extend into a sound aperture in a case. However, in certain embodiments, a sound channel member may be included, such that the sound channel member extends at least partially into a sound aperture of a case (see, e.g. FIGS. 7A and 8 and disclosure above).

Figure 9B:
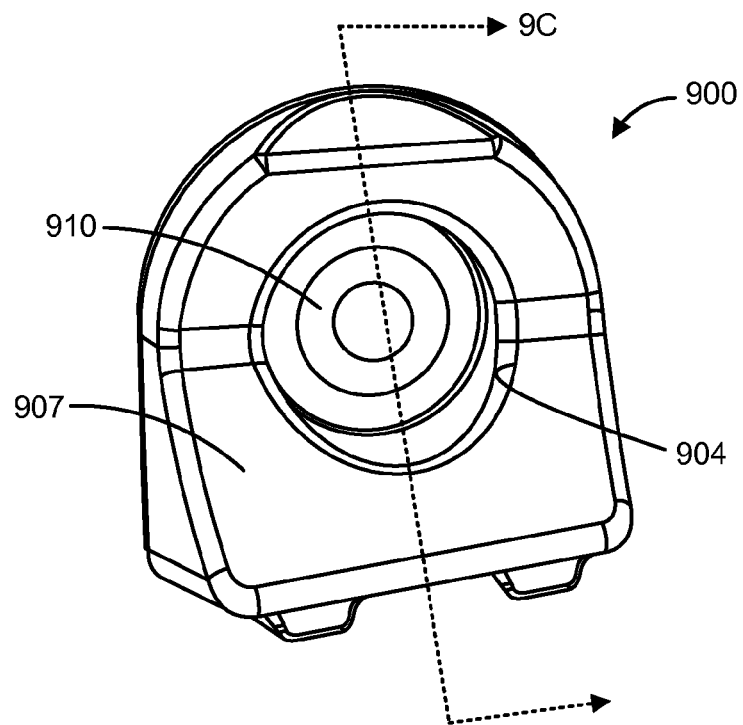
FIG. 9B is a perspective view of the other side of the acoustic isolation mechanism of FIG. 9A.

Returning to FIG. 9A, the interior face 906 is adapted to acoustically seal against a portion of an electronic device that is proximate the microphone of the electronic device, thus isolating the microphone from sound and vibration within the case (not shown). FIG. 9B shows a perspective view of the exterior face 907 of the acoustic isolation mechanism 900. Preferably, the acoustic membrane may be disposed in the sound channel closer to the interior face of the sound isolation mechanism (near the exterior surface of the mobile device), as seen in FIGS. 9A and 9B. However, the acoustic membrane may be disposed closer to the exterior face of the acoustic isolation mechanism (closer to the exterior of the case), or may be disposed proximate the middle of the sound channel. The acoustic membrane 910 and the acoustic channel 904 provide a waterproof acoustic coupling between sounds outside the case and an electronic device microphone (e.g. using a waterproof adhesive, direct molding or bonding, etc.).

In some embodiments, the diameter of an acoustic membrane that spans or covers a sound channel may be: between about 0.1 mm and about 5 mm. In certain embodiments, the diameter of an acoustic membrane that spans or covers a sound channel may be: between about 0.1 mm and about 0.25 mm; between about 0.25 mm and about 0.5 mm; between about 0.50 mm and about 0.75 mm; between about 0.75 mm and about 1.0 mm; between about 1.0 mm and about 1.5 mm; between about 1.5 mm and about 2.0 mm; between about 2.0 mm and about 2.5 mm; between about 2.5 mm and about 3.0 mm; between about 3.0 mm and about 3.5 mm; between about 3.5 mm and about 4.0 mm; and between about 4.0 mm and about 5 mm. For an irregularly shaped membrane, the diameter is the longest length of a straight line between two edges of the membrane and through the center point of the acoustic membrane.

Figure 9C:
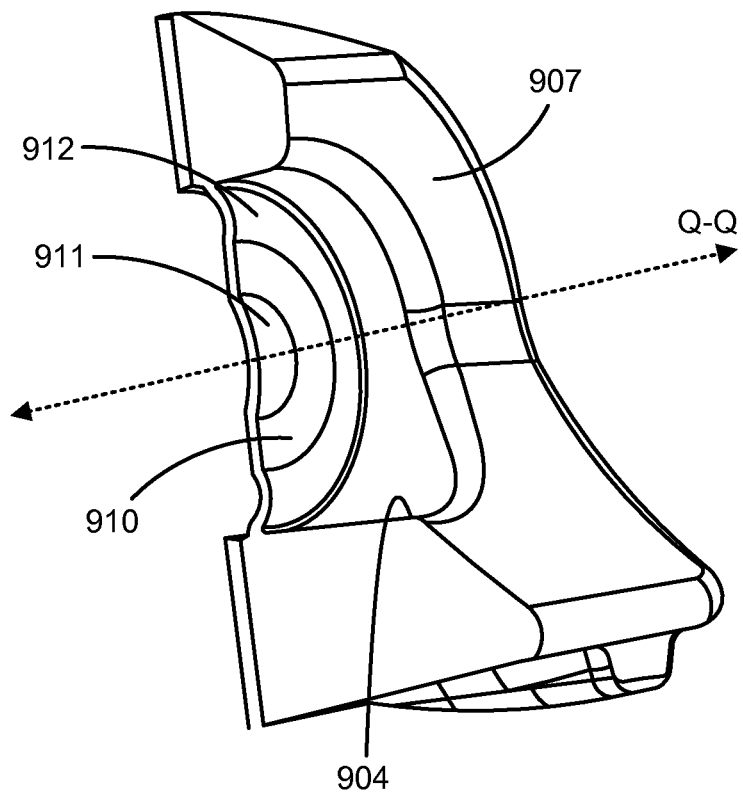
FIG. 9C is a perspective sectional view of the acoustic isolation mechanism of FIG. 9B.

In some embodiments, the plane of the acoustic membrane may transect the sound channel 904 at about a 90 degree angle relative to the central longitudinal axis of the sound channel (see, e.g. central longitudinal axis Q-Q in FIG. 9C). In other embodiments, the acoustic membrane may transect the sound channel at an angle less than about 90 degrees and more than about 0.1 degrees relative to the central longitudinal axis of the sound channel. For example, the angle of the plane of the acoustic membrane relative to the central longitudinal axis may be between about 45 degrees and about 90 degrees, or between about 1 degree and about 45 degrees. The range of available angles will vary with the length of the central longitudinal axis of the sound channel and the diameter of each opening of the sound channel. In certain embodiments, the angle of the plane of the acoustic membrane relative to the central longitudinal axis may be: between about 80 degrees and about 90 degrees; between about 70 degrees and 80 degrees; between about 60 degrees and about 70 degrees; between about 50 degrees and about 60 degrees; between about 40 degrees and about 50 degrees; between about 30 degrees and about 40 degrees; between about 20 degrees and about 30 degrees; between about 10 degrees and about 20 degrees; between about 5 degrees and 10 degrees; between about 1 degree and 5 degrees; and between about 0.1 degrees and 1 degree. In some embodiments, the angle of the plane of the acoustic membrane relative to the central longitudinal axis may be: about 80 degrees; about 70 degrees; about 60 degrees; about 50 degrees; about 40 degrees; about 30 degrees; about 20 degrees; about 10 degrees; about 5 degrees; and about 1 degree.

In some embodiments, the acoustic isolation mechanism may include one or more counterbores or cavities (see, e.g., FIG. 8) and at least one acoustic membrane formed across an entire cross-sectional area of the counterbore, proximate to an end of the sound channel. In certain embodiments, the acoustic membrane is positioned within the sound channel, and still includes a counterbore.

In some embodiments of the instant technology, the acoustic membrane may include flexible structure molded into its plane that contributes to its low acoustic impedance when the entire acoustic isolation mechanism is installed in a protective case. For example, when an acoustic isolation mechanism containing an acoustic membrane is installed in a protective case, the entire mechanism may flex enough to cause bulging in the acoustic membrane, thus increasing the acoustic impedance of the flat acoustic membrane and hindering the ability of the acoustic membrane to vibrate in response to sound. This increase in acoustic impedance reduces the sound quality moving into or out of the case, or can eliminate the transfer of sound altogether. This flexure may occur if the acoustic isolation mechanism is installed in a wall cavity of a protective enclosure and/or when a device is enclosed in a protective enclosure. Additional flexible or accordion-like structure of the acoustic membrane provides additional surface area to the acoustic membrane, and allows the membrane to shift and move in response to static changes in the shape of the sound channel that surrounds the membrane. This shifting allows the membrane to maintain a low acoustic impedance despite any structural shifting of the surrounding sound channel.

For example, FIG. 9C shows a perspective sectional view of acoustic isolation mechanism 900 (section 9C indicated in FIG. 9B). Acoustic membrane 910 with a molded annular arch 912 (located proximate the periphery of the membrane) and a molded central dome 911 (proximate the center of the membrane). The annular arch 912 and central dome 911 are structures molded into the acoustic membrane that can compensate for a certain amount of flexure of the acoustic isolation mechanism. The apex of the dome and annular arch may face towards either the exterior or interior of the case in which they are installed. The number of peripheral arches molded into the acoustic membrane can vary, depending on the limits of molding and the diameter of the acoustic membrane. Furthermore, a central dome may or may not be molded in the acoustic membrane. For example, in some embodiments of acoustic membranes, the membrane may have only a molded annular arch or only a molded central dome. In certain embodiments, the acoustic membrane includes at least one annular arch. In some embodiments, the acoustic membrane includes at least one central dome and at least one annular arch. The shape of an annular arch may be circular, elliptical, a regular polygon, an irregular polygon, or combination of curves and straight lines. In some embodiments of an acoustic membrane, a central cone may be utilized instead of a central dome. The arc lengths and heights of the annular arches and central domes (as well as the height of a peripheral cone) may be adjusted as desired to sufficiently compensate for distortion of the acoustic membrane via the acoustic isolation mechanism, while maintaining a desirable acoustic compliance of the membrane itself (i.e. the ease with which the membrane can react to changes in air pressure). In certain embodiments of acoustic membranes (such as membranes that are polygonal in shape e.g. square), the arches may be linear instead of annular.

The molded structures of the acoustic membrane described above differ in both location and function from roll surrounds that surround passive radiators. The roll surround structure of a passive radiator actually surrounds the diaphragm and is not itself part of the diaphragm. The roll surround enables the passive radiator diaphragm to move appropriately as a whole in response to higher sound pressures (higher volumes) and low frequencies created by a speaker, and are not part of the diaphragm itself.

Figure 10A:
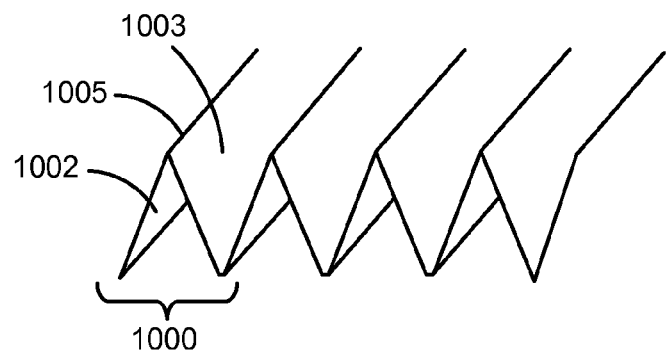
FIG. 10A is a perspective view of an exemplary accordion pleat that can be used in an acoustic membrane.
Figure 10B:
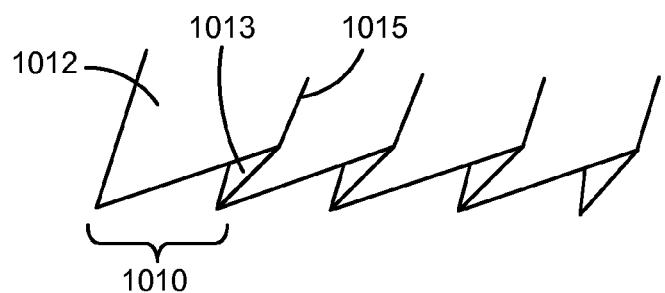
FIG. 10B is a perspective view of an exemplary side pleat that can be used in an acoustic membrane.
Figure 10C:
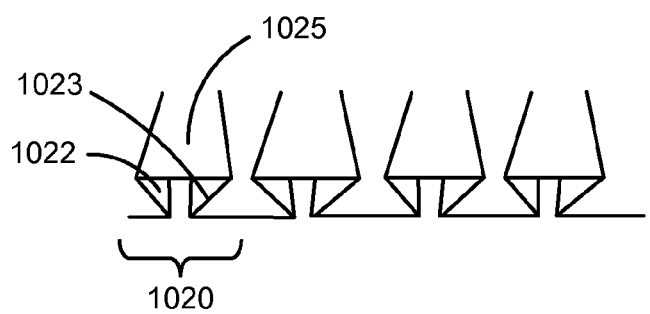
FIG. 10C is a perspective view of an exemplary box pleat that can be used in an acoustic membrane.

In some embodiments of an acoustic membrane, the membrane may include at least one molded pleat on at least a portion of the acoustic membrane. Such pleats may be linear or annular and complement or replace linear and/or annular arches and central domes and/or cones. The pleats may be molded as annular pleats, similar to the annular arches depicted in FIGS. 9A-C. FIG. 10A-10B illustrates three types of pleats that may be molded into an acoustic membrane, either alone or in combination. FIG. 10A shows a series of accordion pleats 1000, a pleat with symmetrical sides 1002 and 1003 and ending in a ridge 1005. FIG. 10B shows a side pleat 1010, wherein sides 1012 and 1013 are asymmetric in height, forcing the apex of each pleat (ridge 1015) to lay at an angle. FIG. 10C shows a box pleat 1020, which has two sides 1022 and 1023 connected by a panel 1025. The sides 1022 and 1023 may be symmetrical or asymmetrical. Panel 1025 may be curved. In some embodiments of an acoustic membrane with molded features, one or more molded accordion pleats may be combined with one or more side pleats and/or one or more box pleats.

Figure 11A:
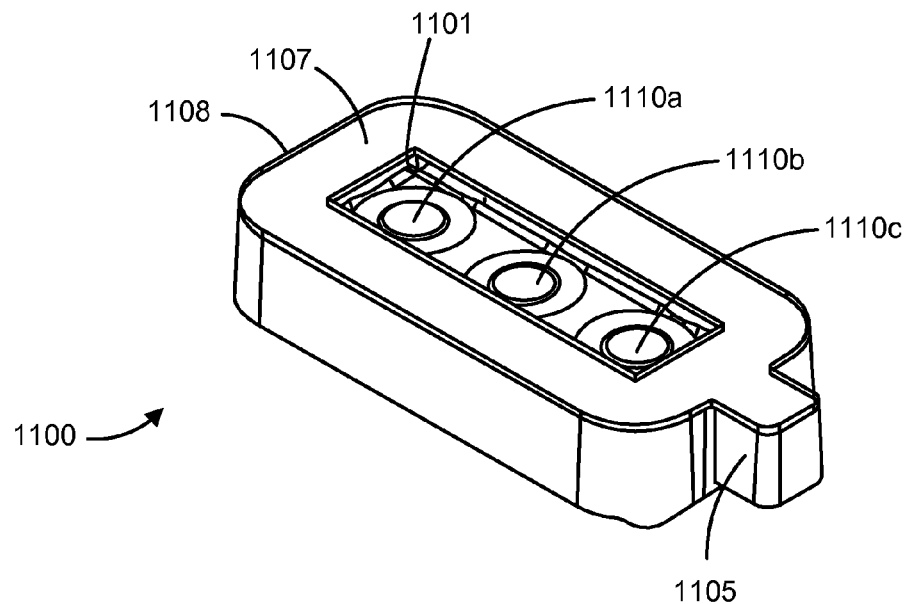
FIG. 11A is a perspective view of the exterior face of an exemplary acoustic isolation mechanism with multiple co-molded acoustic membranes.
Figure 11B:
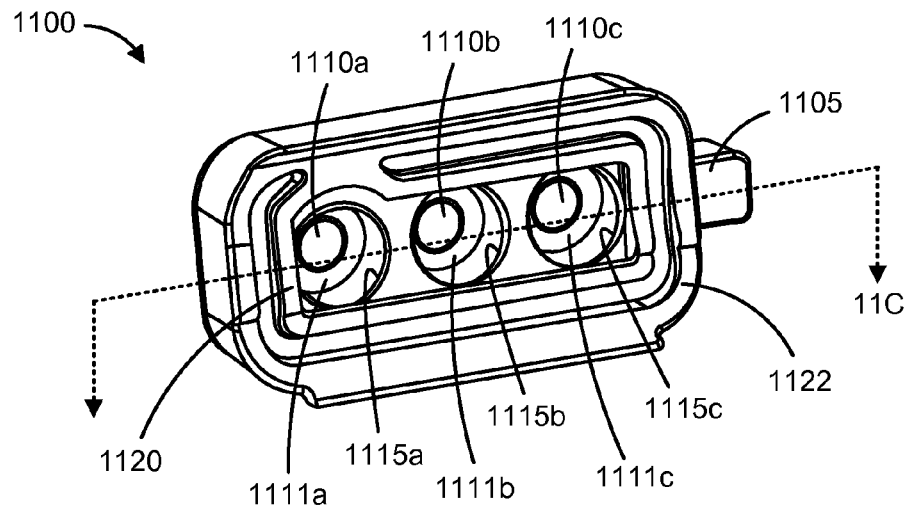
FIG. 11B is a perspective view of the interior face of an exemplary acoustic isolation mechanism with multiple co-molded acoustic membranes.

In some embodiments of an acoustic isolation mechanism, the mechanism includes more than one sound channel, with each sound channel including a waterproof membrane. For example, FIG. 11A shows a perspective view of an acoustic isolation mechanism 1100 having a counterbore or cavity 1101 and three acoustic membranes 1110a, 1110b, and 1110c. The acoustic membranes 1110a-c are positioned proximate the interior end of sound channels 1115a, 1115b, and 1115c. An adhesive layer 1108 is shown on the exterior face 1107 (the face of the mechanism that abuts the device). The embodiment depicted includes an orientation tab 1105 that helps to ensure that acoustic isolation mechanism 1100 is installed in the case in the correct orientation and manipulate the acoustic isolation mechanism 1100 during installation in the case. FIG. 11B shows a perspective view of the interior face 1106 of the acoustic isolation mechanism 1100. The openings of all three sound channels 1115a-c are surrounded by an inner sealing wall 1120 and an outer sealing wall 1122. The sealing walls are adapted such that at least a portion of each sealing wall can collapse against the exterior of a device installed in the case, forming an acoustic seal against the device, and preventing sound leakage between the acoustic membranes 1110a-c and the microphone of the installed device. The collapsible nature of the inner sealing wall 1120 and outer sealing wall 1122 allow the acoustic isolation mechanism form an acoustic seal similar to that of compliant foam, while being made of a single material that is stiffer than compliant foam. In certain embodiments, the acoustic isolation mechanism may have only a single collapsible sealing wall surrounding the sound channels (or even a single sound channel, such as with the isolation mechanism described above and shown in FIGS. 9A-C). In some embodiments, the sealing walls may not be contiguous with the interior face of the acoustic isolation mechanism; instead, one or more sealing walls may be formed from compliant foam adhered to the interior face, or from a more compliant elastomer overmolded to the stiffer isolation mechanism.

Each acoustic membrane includes an annular arch 1111a, 1111b, 1111c (see also FIGS. 9A-C). In certain embodiments, each of the acoustic membranes 1111a-c may be molded into different positions along the longitudinal axis of their respective sound channels 1115a-c. In some embodiments, each of the acoustic membranes 1110a-c may be molded at different angles relative to the longitudinal axis of their respective sound channels 1115a-c. In some embodiments, each of the sound channels may include a counterbore including a cavity surface that allows a breathable waterproof textile (e.g. GORE-TEX) to be adhered to the cavity surface (see disclosure above and FIG. 8).

Figure 11C:
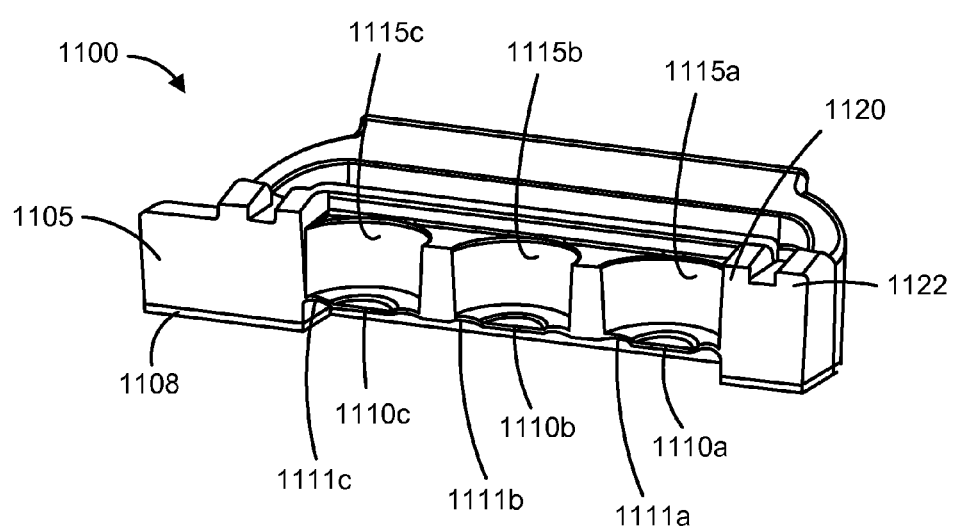
FIG. 11C is a sectional illustration of the exemplary acoustic isolation mechanism of FIG. 11B.

FIG. 11C shows a perspective sectional view of acoustic isolation mechanism 1100 at section 11C (indicated in FIG. 11B). Annular arches 1111a-c and sound channels 1115a-c are visible, as well as inner sealing wall 1120 and outer sealing wall 1122. The sealing walls 1120 and 1122 have varying heights and curves in order to more closely conform to the exterior shape of the device to be housed in an encasement. As indicated above, the shapes of each of the sound channels 1115a-c may vary in shape, such as elliptical, polygonal, and may be irregular in shape. The channels may also from a truncated cone. Each of the acoustic membranes 1110a-c may vary in their molded structure, such as containing additional annular arches, a central dome, or even pleats (e.g. accordion pleats, side pleats or box pleats).

Figure 12A:
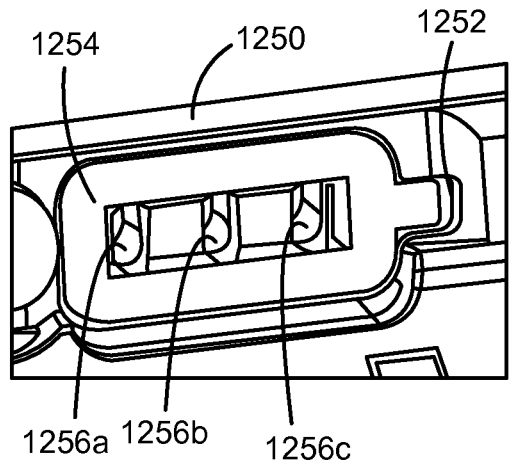
FIG. 12A is a perspective illustration of an interior portion of a case wall with a cavity to receive an acoustic isolation mechanism.
Figure 12B:
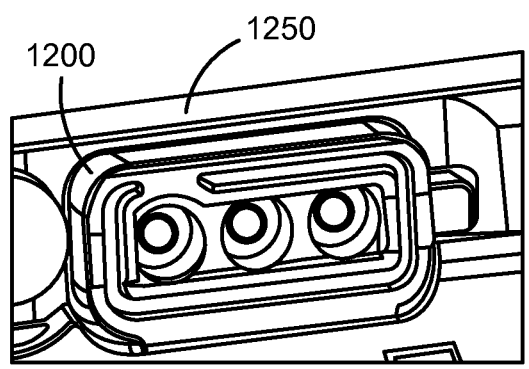
FIG. 12B a perspective illustration of an interior portion of a case wall that has received an acoustic isolation mechanism similar to that shown in FIG. 11B.

FIG. 12A shows a perspective view of an interior portion of a case wall 1250 configured to receive an acoustic isolation mechanism 1200. Case wall 1250 includes a mounting cavity 1252, shown in FIG. 12A along with an adhesive layer 1254. Sound ports 1256a, 1256b, and 1256c are positioned proximate the location of sound channels 1115a-c of acoustic isolation mechanism 1100. FIG. 12B shows an acoustic isolation mechanism 1100 adhered to mounting cavity 1252 of case wall 1250. In some case embodiments, case wall 1250 may lack a mounting cavity and simply provide a flat surface for attachment. In certain embodiments, an acoustic isolation mechanism may be molded directly to the interior surface of an encasement without adhesive, using secondary molding techniques.

Figure 13A:
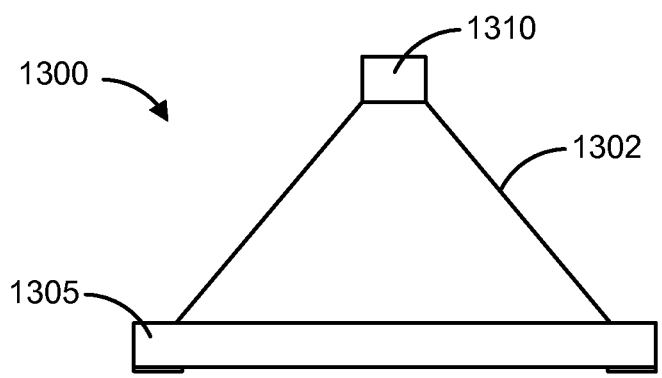
FIG. 13A is a side view of an exemplary sound transmission apparatus with a conical acoustic membrane.

Another exemplary embodiment of a molded acoustic isolation mechanism with an acoustic membrane having a truncated cone-shaped configuration is illustrated in FIG. 13A. FIG. 13A is a side view of a sound transmission apparatus 1300. Acoustic membrane 1302 is shaped in a truncated cone configuration, and is connected to an acoustic isolation mechanism 1305 at its wider circumference. At the smaller circumference of the acoustic membrane 1302 is an anchor knob 1310. Acoustic isolation mechanism 1305 and anchor knob 1310, being connected to the acoustic membrane 1302, each provide some structure to the entire sound transmission apparatus 1300 and allow it to be installed as a single unit. The acoustic isolation ring 1305 may be circular or elliptical. In some embodiments, acoustic isolation mechanism 1305 and acoustic membrane 1302 may be molded from the same waterproof elastomer, and anchor knob 1310 may be adhered or bonded separately.

Figure 13B:
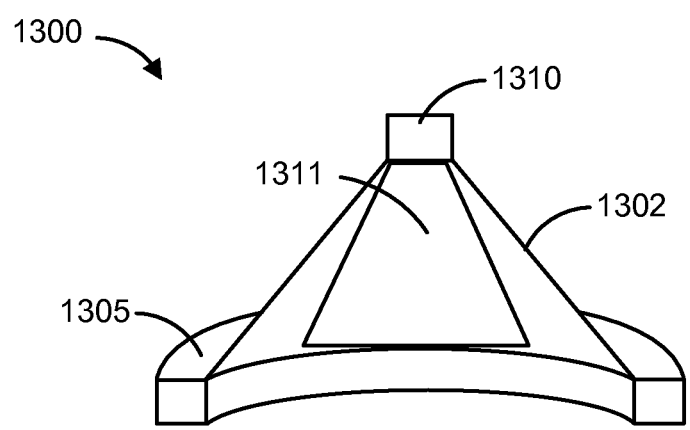
FIG. 13B is a sectional side view of the sound transmission apparatus of FIG. 13A.

FIG. 13B shows a perspective sectional view of acoustic isolation mechanism 1300. Anchor knob 1310 extends to an optional stability member 1311 positioned inside the cone formed by acoustic membrane 1302. When a case having acoustic isolation mechanism 1300 is placed underwater at increasing depths, the acoustic membrane is pressed inward. Due to the membrane's thinness, increased pressure from water could lead stretching or tearing of the membrane. Stability member 1311 acts as an internal backstop to acoustic membrane 1302 when exposed to pressure from water, thus preventing the membrane from being damaged. The truncated cone shape of stability member 1311 is such that vibration of the acoustic membrane during normal usage is not hampered by contact with the stability member.

Figure 13C:
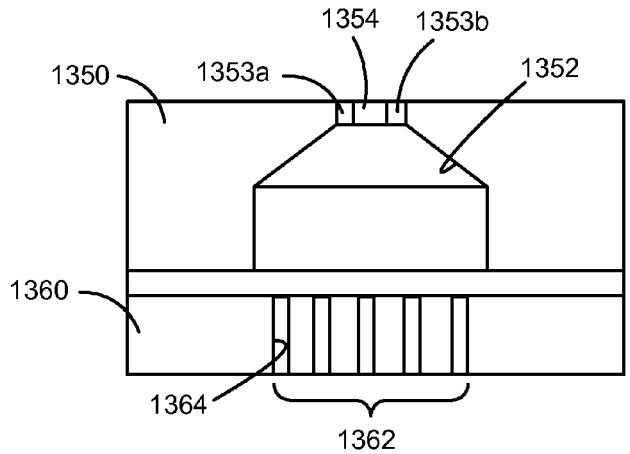
FIG. 13C is a sectional side view of a case wall cavity that is adapted to receive a sound transmission apparatus with a conical membrane (as well as a portion of the electronic device protected by the case wall).

FIG. 13C is a schematic sectional side view of a case wall 1350 and a microphone grill 1362 of an enclosed electronic device 1360. Device 1360 includes a plurality of holes 1364 that are acoustically coupled with the internal microphone (not shown) of the electronic device. The case wall 1350 is adapted to receive the sound transmission apparatus 1300, with the sound transmission apparatus removed for clarity. Case wall 1350 includes a cavity 1352 for retaining a sound transmission apparatus 1300. Sound apertures 1353a and 1353b are in acoustic communication with cavity 1352 and surround an anchor region 1354. The anchor region 1354 is positioned to allow attachment with an anchor knob on a sound transmission apparatus (e.g., see FIGS. 13A-B and disclosure above).

Figure 13D:
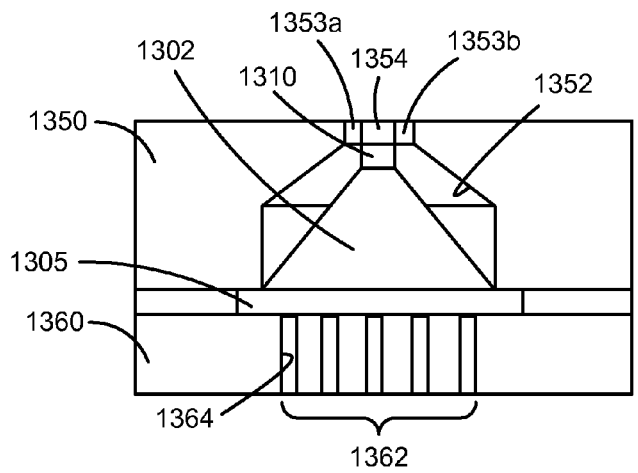
FIG. 13D is a sectional side view of the case wall cavity and electronic device, including a side view (non-sectional) of a sound transmission apparatus.
Figure 13E:
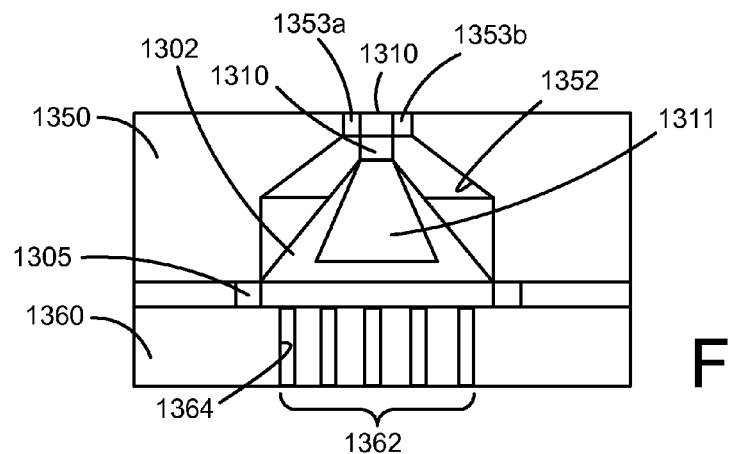
FIG. 13E is a sectional side view of the case wall cavity, electronic device, and the sound transmission apparatus of FIG. 13D.

FIG. 13D is a sectional side view of case wall 1350, with a side view (non-sectional) of an attached sound transmission apparatus 1300. Acoustic isolation ring 1305 is compressed between the interior surface of case wall 1350 and device 1360. Anchor knob 1310 is attached to anchor region 1354 of case wall 1350 (e.g. using adhesive). In addition to providing physical structure, anchor knob 1310 provides a dampening barrier between the wall of the protective case and the acoustic membrane 1302. The anchor knob 1310 can reduce the propagation of spurious vibrations from the wall of the case to the acoustic membrane, if the anchor knob is less hard than the anchor wall. In some embodiments, additional dampening material may be adhered or bonded to the anchor knob 1310, providing additional acoustic isolation of the sound transmission apparatus from the wall of the case. The acoustic isolation ring may also be adhered or bonded to the case wall 1350. FIG. 13E shows a sectional side view of both case wall 1350 and sound transmission apparatus 1300, such that stability member 1311 is also visible. In some embodiments of sound transmission apparatus 1300, the acoustic membrane may form a truncated pyramid, with the acoustic isolation ring being a polygon instead of a circle or ellipse. The polygon of the acoustic isolation ring may have three, four, five, six, seven, eight, nine, ten, or more sides.

Acoustic isolation mechanisms that include molded acoustic membranes, such as those described above, are especially useful with waterproof encasements for mobile electronic devices (such as smartphones and tablets). However, without waterproof passage for pressure equalization, pressure differentials between the inside and outside of the case can render the molded acoustic membrane much less compliant. This drastically increases the acoustic impedance of the membrane and hindering or eliminating the passage of sound through the case.

In such waterproof cases, a pressure relief aperture may be located in the case, and is covered by an air-permeable waterproof textile (e.g. GORE-TEX). The air-permeable waterproof textile may be adhered or bonded to case (e.g. using a secondary molding process). The pressure relief aperture may be a small aperture located anywhere in the body of the case. Coupled with an air-permeable waterproof textile, the pressure relief aperture allows movement of gases (e.g. air) between the exterior and interior of the case, thus permitting any pressure differential to equalize. Exemplary waterproof cases that may utilize acoustic isolation mechanisms with non-breathable acoustic membranes are disclosed in U.S. Pat. Nos. 8,342,325 and 8,531,834, each of which is incorporated herein by reference in its entirety.

The foregoing description of the subject matter has been presented for purposes of illustration and description. It is not intended to be exhaustive or to limit the subject matter to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments except insofar as limited by the prior art.

What is claimed is:

1. A protective cover for an electronic device, the protective cover comprising:
    a case for at least partially enclosing the electronic device, the case having a hard shell that at least partially encases the electronic device, the hard shell having a first sound aperture proximate an acoustic opening of the electronic device when the electronic device is installed in the case, the case having a removable silicone layer configured to fit around the hard shell, the removable silicone layer having a second sound aperture that aligns with the first sound aperture of the hard shell; and
    an acoustic isolation mechanism extending from the silicone layer of the case proximate the acoustic opening of the installed electronic device, the acoustic isolation mechanism comprising:
        a face oriented towards an interior of the case, the face contacting the installed electronic device,
        at least one acoustic channel extending from the face through the first sound aperture of the hard shell and the aligned second sound aperture of the silicone layer that acoustically couples the acoustic opening of the installed electronic device with the case, and
        at least one acoustic membrane co-molded to the acoustic isolation mechanism, the at least one acoustic membrane spanning a cross-section of the at least one acoustic channel and having a substantially constant thickness across an area of the at least one acoustic membrane.

2. The protective cover according to claim 1, wherein the at least one acoustic membrane is positioned proximate the face of the acoustic isolation mechanism.

3. The protective cover according to claim 2, wherein the at least one acoustic membrane comprises one or more molded structures selected from the group consisting of: an arch, a dome, a cone, an accordion pleat, a side pleat, and a box pleat.

4. The protective cover according to claim 1, wherein the at least one acoustic channel includes a ledge to which the at least one acoustic membrane is attached.

5. The protective cover according to claim 1, wherein the acoustic isolation mechanism further comprises at least one counterbore on the face proximate the at least one acoustic channel to which the at least one acoustic membrane is attached.

6. The protective cover according to claim 1, wherein the case further comprises one or more pressure relief apertures between the installed electronic device, through the hard shell, and to an outer surface of the removable silicone layer, each of the one or more pressure relief apertures covered by an air-permeable waterproof textile.

7. The protective cover according to claim 1, wherein a plane of the at least one acoustic membrane transects the at least one acoustic channel at an angle of about 90 degrees relative to a central longitudinal axis of the at least one acoustic channel.

8. The protective cover according to claim 1, wherein a plane of the at least one acoustic membrane transects the acoustic channel at an angle less than about 90 degrees and more than about 0.1 degrees relative to a central longitudinal axis of the at least one acoustic channel.

9. The protective cover according to claim 1, wherein the face of the acoustic isolation mechanism comprises a plurality of acoustic sealing walls proximate the at least one acoustic channel.

10. A protective cover for an electronic device, the protective cover comprising:
    a shell configured to partially surround an electronic device, the shell having a first sound opening; and
    a removable silicone layer fitted over the shell, the removable silicone layer having a second sound opening aligned with the first sound opening of the shell, the removable silicone layer having an acoustic isolation mechanism, the acoustic isolation mechanism comprising:
        a face to form an acoustic seal with the electronic device when the electronic device is installed in the protective cover, at least one acoustic channel extending from the face through the first sound opening of the shell and the aligned second sound opening of the removable silicone layer, the at least one acoustic channel to acoustically couple the electronic device to the protective cover when the electronic device is installed in the protective cover, and at least one acoustic membrane that spans a cross-section of the at least one acoustic channel, wherein the at least one acoustic membrane is molded from a waterproof elastomer, the at least one acoustic membrane having a substantially constant thickness.

11. The protective cover of claim 10, wherein the at least one acoustic membrane is positioned proximate the face of the acoustic isolation mechanism.

12. The protective cover according to claim 10, wherein the acoustic isolation mechanism is molded from the waterproof elastomer of the at least one acoustic membrane.

13. The protective cover of claim 10, wherein the at least one acoustic membrane comprises one or more molded structures selected from the group consisting of: an arch, a dome, a cone, an accordion pleat, a side pleat, and a box pleat.

14. The protective cover of claim 10, wherein a plane of the at least one acoustic membrane transects the at least one acoustic channel at an angle of about 90 degrees relative to a central longitudinal axis of the at least one acoustic channel.

15. The protective cover of claim 10, wherein the plane of the at least one acoustic membrane transects the at least one acoustic channel at an angle less than about 90 degrees and more than about 0.1 degrees relative to the central longitudinal axis of the at least one acoustic channel.

16. The protective cover of claim 10, wherein the face of the acoustic isolation mechanism comprises a plurality of acoustic sealing walls proximate the at least one acoustic channel.

17. An encasement for an electronic device, the encasement having an acoustic isolation mechanism for interacting with an electronic device installed in the encasement, the electronic device having a microphone and the encasement having a sound opening proximate the microphone, the acoustic isolation mechanism of the encasement comprising:

a sound channel member extending from a removable silicone layer of the encasement, the removable silicone layer surrounding a hard shell of the encasement that at least partially encases the installed electronic device, the sound opening of the encasement extending through the removable silicone layer and the hard shell;

an interior face on an end of the sound channel member of the removable silicone layer, the interior face configured to form an acoustic seal with the electronic device when the electronic device is installed in the encasement; and at least one acoustic channel extending from the interior face through the sound channel member of the acoustic isolation mechanism, the at least one acoustic channel acoustically coupling the microphone of the electronic device to the sound opening of the encasement.

18. The encasement of claim 17, further comprising at least one acoustic membrane that spans a cross-section of the at least one acoustic channel, wherein the at least one acoustic membrane comprises a material selected from: a breathable waterproof textile, and a waterproof elastomer.

19. The encasement according to claim 18, wherein the at least one acoustic membrane is molded from a waterproof elastomer.

20. The encasement according to claim 19, wherein the acoustic isolation mechanism is molded from the waterproof elastomer of the at least one acoustic membrane.

21. The encasement according to claim 18, wherein the at least one acoustic membrane comprises one or more molded structures selected from the group consisting of: an arch, a dome, a cone, an accordion pleat, a side pleat, and a box pleat.

22. The encasement according to claim 18, wherein the at least one acoustic membrane is positioned proximate the interior face of the acoustic isolation mechanism.

23. The encasement according to claim 18, wherein the at least one acoustic channel includes a ledge to which the at least one acoustic membrane is attached.

24. The encasement according to claim 18, wherein the acoustic isolation mechanism further comprises at least one counterbore on the interior face proximate the at least one acoustic channel to which the at least one acoustic membrane is attached.

25. The encasement according to claim 17, wherein the interior face of the acoustic isolation mechanism comprises a plurality of acoustic sealing walls proximate the at least one acoustic channel.

* * * * *